United States Patent [19]

Akiyama et al.

[11] Patent Number: 5,982,474
[45] Date of Patent: Nov. 9, 1999

[54] PERIPHERY EXPOSING APPARATUS AND METHOD

[75] Inventors: Kazuya Akiyama; Kenji Kamei; Satoshi Yamamoto, all of Kyoto, Japan

[73] Assignee: Dainippon Screen Mfg. Co., Ltd., Japan

[21] Appl. No.: 08/868,382

[22] Filed: Jun. 3, 1997

[30] Foreign Application Priority Data

| | | | |
|---|---|---|---|
| Jun. 6, 1996 | [JP] | Japan | 8-168648 |
| Oct. 9, 1996 | [JP] | Japan | 8-239499 |
| Oct. 23, 1996 | [JP] | Japan | 8-285233 |

[51] Int. Cl.$^6$ .......................... G03B 27/42; G03B 27/48
[52] U.S. Cl. .......................................... 355/53; 355/50
[58] Field of Search .......................... 355/50, 51, 53, 355/67, 68, 69, 77; 356/375, 399, 400, 401; 250/548

[56] References Cited

U.S. PATENT DOCUMENTS

| | | | |
|---|---|---|---|
| 4,899,195 | 2/1990 | Gotoh | 355/77 |
| 4,910,549 | 3/1990 | Sugita | 355/53 |
| 5,168,021 | 12/1992 | Arai et al. | 430/22 |
| 5,168,304 | 12/1992 | Hattori | 344/50 |
| 5,229,811 | 7/1993 | Hattori et al. | 355/50 |
| 5,289,263 | 2/1994 | Kiyokawa et al. | 356/375 |
| 5,361,121 | 11/1994 | Hattori et al. | 355/50 |
| 5,420,663 | 5/1995 | Nakajima et al. | 355/50 |

FOREIGN PATENT DOCUMENTS

| | | |
|---|---|---|
| 2-288221 | 11/1990 | Japan . |
| 2-288326 | 11/1990 | Japan . |
| 3-242922 | 10/1991 | Japan . |

*Primary Examiner*—Safet Metjahic
*Assistant Examiner*—Hung Henry Nguyen
*Attorney, Agent, or Firm*—Ostrolenk, Faber, Gerb & Soffen, LLP

[57] ABSTRACT

A method and apparatus for exposing a substrate to light perform the steps of inputting position data of a peripheral region along an outline of a chip region on a substrate, which has been placed on a spin chuck, detecting a reference position at an outer edge of the substrate inputting axial directions of the position data and aligning axial directions of an orthogonal shifting mechanism. Based on the position data inputted, light of an irradiator is shifted along the peripheral region to expose the peripheral region in a staggered way along the outline of the chip region. The method and apparatus may also perform the steps of inputting a shape of the chip region on the substrate as image information, deriving position data of the peripheral region along the outline of the chip region from the image information, and exposing the peripheral region to light based on the position data derived. The method and apparatus may also perform the steps of inputting shape information of the substrate, the chip region, and an area around a crossing point of scribe lines in the chip region on the substrate as image information, computing the positions of the peripheral region from the image information and the shape information of the substrate and the chip region; and exposing the peripheral region to light based on the positions of the computed peripheral region.

15 Claims, 28 Drawing Sheets

PERIPHERY EXPOSING APPARATUS AND METHOD

BACKGROUND OF THE INVENTION (1) Field of the Invention

This invention relates to a periphery exposing apparatus and methods for exposing edge regions (peripheries) of photo-sensitive layers applied to surfaces of substrates such as semiconductor wafers.

(2) Description of the Related Art

In a process of manufacturing semiconductor devices, a resist solution is spin-coated a substrate such as a semiconductor wafer and developed into a predetermined pattern to form a resist mask. The resist mask is thereafter used to form film patterns.

The substrate which has been spin-coated with the resist solution is transported by gripping it at its edge regions and moving it thereof from one type of substrate treating apparatus to another. The resist solution, however, has been spread to the edge regions of the substrate by the spin coating step. Thus, when the edge regions of the substrate are gripped, the resist is separates from the edge regions, scatters and contaminates a resist surface in a central region of the substrate and other substrate surfaces. This could reduce the yield of substrate processing.

In the case of a positive type resist, the resist in the edge regions of a substrate is exposed, in advance by using a periphery exposing apparatus. Unwanted parts of the resist are removed from the edge regions of the substrate at the time of of the resist pattern development.

A conventional periphery exposing apparatus employs a method of exposing an annular region of fixed width from the outer edge of a substrate. Such a periphery exposing apparatus mechanically detects the position of an orientation flat or notch of the substrate by using a cam placed in contact the outer edge of the substrate. The orientation flat or notch is used as a reference for determining the annular region of fixed width from the outer edge of the substrate, and then the annular region is exposed.

Another type of conventional apparatus optically detects an orientation flat or notch of a substrate by using a line sensor. Here again, the orientation flat or notch is used as a reference for determining an annular peripheral region of fixed width, and then the annular region is exposed.

In recent years, there has been an increasing desire to remove unwanted resist from edge regions of a substrate more thoroughly in order to prevent, with increased assurance, contamination by particles scattering from the resist.

In another conventional scheme, a plurality of rectangular chips are formed on the substrate. The chips in an array (i.e. a chip region) describe a staggered or stepped outline while, the substrate or wafer is substantially circular. Simply exposing the peripheral region of fixed width from the outer edge of the substrate would leave unwanted resist in areas between this region and the stepped outline of the chip region.

A periphery exposing apparatus has been proposed which is capable of exposing the peripheral region along the stepped outline of the chip region. This conventional apparatus acquires, and stores in memory, position data of the stepped peripheral region along the outline of the chip region in advance. Based on the position data, an irradiator is shifted in two orthogonal directions for irradiating, with light, the substrate supported by a substrate supporting mechanism. In this way, the peripheral region is exposed in a staggered way along the outline of the chip region.

However, the following inconveniences are encountered with the conventional apparatus for exposing the peripheral region in a staggered way. The position data of the stepped peripheral region stored in advance are determined according to the chip region. Each chip in the chip region is formed on the substrate, for example, with reference to the orientation flat of the substrate or the like. On the other hand, the irradiator is shifted in the two orthogonal directions by a shifting mechanism disposed adjacent the substrate supporting mechanism. When the substrate is supported by the substrate supporting mechanism, a deviation may occur in a positional relationship between the orientation flat of the substrate and the shifting mechanism. Consequently, the two orthogonal directions in which the irradiator is moved do not always concur with the stepped outline of the chip region actually formed on the substrate. With such a deviation between the irradiator and the substrate supported by the substrate supporting mechanism, the peripheral region cannot be exposed along the stepped outline of the chip region with high precision.

Another drawback is that the positions of chips actually formed on the substrate (i.e. the position of the outline of the chip region on the substrate) may vary from substrate to substrate. In this case, the peripheral exposure region of each substrate deviates from the position data of the peripheral region stored in advance. This results in a defective periphery exposure which exposes even indispensable portions of the resist on the chips or leaves portions that should be removed. In addition, it is a troublesome operation to acquire and store the positional data of the peripheral exposure region in advance, which is no small burden on the operator.

SUMMARY OF THE INVENTION

The object of this invention is to provide a periphery exposing apparatus and method for exposing a peripheral region along a staggered or stepped outline of a chip region on a substrate with high precision.

The above object is fulfilled, in accordance with a first aspect of this invention, by a periphery exposing apparatus for exposing a peripheral region around a chip region of a photosensitive layer applied to a substrate, in a staggered way along an outline of the chip region, comprising:

a substrate supporting mechanism for supporting the substrate;

a detector for detecting a reference position at an outer edge of the substrate supported by the substrate supporting mechanism;

an irradiator for irradiating, with light, the photosensitive layer on the substrate supported by the substrate supporting mechanism;

an orthogonal shifter for shifting the light of the irradiator in two orthogonal directions relative to the photosensitive layer;

a position data input unit for inputting position data of the peripheral region along the outline of the chip region;

an aligning device for aligning axial directions of the position data and the orthogonal shifter based on results of detection provided by the detector; and a control unit for controlling the orthogonal shifter to shift the light of the irradiator along the peripheral region based on the position data, thereby to expose the peripheral region in a staggered way along the outline of the chip region.

A periphery exposing method executed by the above periphery exposing apparatus in accordance with the first aspect of this invention comprises the steps of:

(A-1) inputting position data of the peripheral region along the outline of the chip region;

(A-2) detecting a reference position at an outer edge of the substrate supported by the substrate supporting mechanism;

(A-3) aligning, based on results of the detection obtained at step (A-2) above, axial directions of the position data inputted at step (A-1) above and two orthogonal directions for shifting the light of the irradiator relative to the photosensitive layer on the substrate; and (A-4) shifting the light of the irradiator along the peripheral region based on the position data, thereby to expose the peripheral region in a staggered way along the outline of the chip region.

According to the periphery exposing apparatus and method in the first aspect of this invention, when axial directions of the position data inputted and the orthogonal shifter are out of alignment, with the substrate transported to and placed on the substrate supporting mechanism, the aligning device (at step (A-3)) aligns the axial directions of the position data and the orthogonal shifter. Thus, the peripheral region may be exposed by shifting the light of the irradiator with high precision along the axial directions of the position data. The periphery exposure is carried out with high precision along the stepped outline of the chip region.

The peripheral region may be divided into a plurality of regions, the peripheral region being exposed one division after another.

The construction for exposing the peripheral region one division after another includes, for example, a construction for causing one irradiator to expose divided peripheral regions successively, and a construction for causing a plurality of irradiators to expose the divided peripheral regions simultaneously.

With the former, it is sufficient if the light of the irradiator can be shifted in two orthogonal directions within the relatively narrow divided peripheral regions. The orthogonal shifter may have a diminished range for shifting in the two orthogonal directions. The orthogonal shifter itself may be formed complactly to miniaturize the apparatus. The periphery exposure may be effected for large substrates for the shifting range of the orthogonal shifter. On the other hand, the latter construction provides for an improved throughput of the periphery exposing process.

The periphery exposing apparatus in accordance with the first aspect of the invention may further comprise a rotating device for rotating the light of the irradiator relative to the photosensitive layer on the substrate supported by the substrate supporting mechanism and along an arcuate edge of the substrate.

In this case, the control unit controls the rotating device to shift the light of the irradiator along the arcuate edge of the substrate before or after exposure along the peripheral region of the photosensitive layer, to expose portions of the peripheral region remaining unexposed as a result of the exposure along the peripheral region.

The peripheral region is exposed in two stages consisting of the exposure along the peripheral region, and the exposure along the arcuate edge of the substrate. Even if portions of the peripheral region remain unexposed after the exposure along the peripheral region, these unexposed portions may be exposed through the exposure along the arcuate edge of the substrate. Thus, the entire peripheral region may be exposed with high precision, without leaving unexposed portions.

In accordance with a second aspect of this invention, there is provided a periphery exposing apparatus for exposing a peripheral region around a chip region of a photosensitive layer applied to a substrate, in a staggered way along an outline of the chip region, comprising:

a substrate supporting mechanism for supporting the substrate;

an image input unit for inputting, as image information, a shape of the chip region on the substrate supported by the substrate supporting mechanism;

an image processor for deriving position data of the peripheral region along the outline of the chip region, from the image information;

an irradiator for irradiating, with light, the photosensitive layer on the substrate supported by the substrate supporting mechanism;

a shifter for shifting the light of the irradiator relative to the photosensitive layer;

a control unit for controlling the shifter to shift the light of the irradiator based on the position data, thereby to expose the peripheral region.

A periphery exposing method executed by the above periphery exposing apparatus in accordance with the second aspect of this invention comprises the steps of:

(B-1) inputting, as image information, a shape of the chip region on the substrate supported by the substrate supporting mechanism;

(B-2) deriving position data of the peripheral region along the outline of the chip region, from the image information inputted at step (B-1) above; and (B-3) shifting the light of the irradiator relative to the photosensitive layer on the substrate supported by the substrate supporting mechanism, based on the position data derived at step (B-2) above, thereby to expose the peripheral region.

According to the periphery exposing apparatus and method of the second aspect of this invention, the shape of the chip region on the substrate supported by the substrate supporting mechanism is inputted as image information, and position data of the peripheral region are derived directly from the image information. Thus, position data of the peripheral region are derived from the chip region actually formed on the substrate supported by the substrate supporting mechanism. Compared with the conventional apparatus, the apparatus according to this invention provides an improved precision of the position data of the peripheral region. Periphery exposure is carried out based on the high-precision position data of the peripheral region, whereby the peripheral region may be exposed with high precision along the stepped outline of the chip region. The operator has a reduced burden since there is no need to acquire and store position data of the peripheral region in advance.

The shifter of the periphery exposing apparatus in the second aspect may include an orthogonal shifter for shifting the light of the irradiator in two orthogonal directions relative to the photosensitive layer to expose the peripheral region in a staggered way. The shifter may include, as necessary, a rotating device for rotating the light of the irradiator relative to the photosensitive layer on the substrate supported by the substrate supporting mechanism and along an arcuate edge of the substrate. This construction allows the peripheral region to be exposed in two stages, i.e. exposure along the chip region and exposure along the arcuate edge of the substrate.

Where the shifter includes an orthogonal shifter, the axial directions of the outline of the chip region actually formed on the substrate supported by the substrate supporting mechanism could be out of alignment with the axial directions of the orthogonal shifter. To cope with such a situation, the apparatus may further comprise an aligning device for deriving axial directions of the outline of the chip region on the substrate supported by the substrate supporting mechanism, from the image information, and aligning the axial directions to axial directions of the orthogonal shifter. This construction permits alignment between the axial directions of the outline of the chip region actually formed on the substrate supported by the substrate supporting mechanism and the axial directions of the orthogonal shifter.

In the periphery exposing apparatus in accordance with the second aspect of the invention, the image input unit may have an imaging range smaller than the chip region, and the apparatus may further comprise a rotating device for rotating the substrate supported by the substrate supporting mechanism, stepwise by a predetermined degree, according to the imaging range. In this case, the peripheral region may be divided into a plurality of regions, and the substrate supported by the substrate supporting mechanism may be rotated intermittently by a predetermined angle according to the imaging range, to expose one division after another. This construction is capable of detecting, with high precision, position data of peripheral regions of large substrates as well.

In the above construction, the irradiator and the image input unit may be arranged such that an exposure range of the irradiator and the imaging range of the image input unit overlap each other. Then, steps (B-1) through (B-3) of the above method may be executed by stopping rotation of the substrate for each division and exposing respective divisions of the peripheral region successively. Alternatively, the irradiator and the image input unit may be arranged such that an exposure range of the irradiator and the imaging range of the image input unit are in a non-overlapping relationship with each other. Then, steps (B-1) and (B-2) and step (B-3) of the above method may be executed simultaneously for different divisions of the peripheral region, to expose the divisions successively.

With the former, image input and exposure may be carried out while the substrate is not moving. This precludes an error from occurring, due to a displacement of the substrate, between an actual position of the substrate and the position data of the peripheral region derived from the image information inputted. This permits the exposure of the peripheral region with high precision.

With the latter, image input and exposure may be carried out at the same time, to improve throughput of the periphery exposing process.

In the periphery exposing apparatus in accordance with the second aspect of the invention, the image input unit may have an imaging range larger than the chip region, and the shifter may be constructed to shift the light of the irradiator over an entire area of the photosensitive layer on the substrate supported by the substrate supporting mechanism. Step (B-1) may be executed to input, as the image information, a shape of the entire chip region on the substrate supported by the substrate supporting mechanism. Step (B-2) may be executed to derive position data of the peripheral region along the outline of the entire chip region, from the image information inputted at step (B-1) above. Step (B-3) may be executed to shift the light of the irradiator relative to an entire area of the photosensitive layer on the substrate supported by the substrate supporting mechanism, based on the position data derived at step (B-2) above, thereby to expose the peripheral region. Then, the image information may be inputted in a single operation, and image input and periphery exposure may be carried out while the substrate is not moving. This feature provides for a simplified construction and control of the periphery exposing apparatus, and a simplification of the periphery exposing method.

In the periphery exposing apparatus in accordance with the second aspect of the invention, the shifter may include an orthogonal shifter for shifting the light of the irradiator in two orthogonal directions relative to the photosensitive layer. The apparatus may further comprise a detector for detecting a reference position at an outer edge of the substrate supported by the substrate supporting mechanism, a position data input unit for inputting position data of the peripheral region along the outline of the chip region, and an aligning device for aligning axial directions of the position data and the orthogonal shifter based on results of detection provided by the detector. In this case, the control unit has an additional function for controlling the orthogonal shifter to shift the light of the irradiator along the peripheral region based on the position data. This construction allows a selection between the first periphery exposing method described hereinbefore and the second periphery exposing method. The peripheral region may be exposed by the first periphery exposing method where, for example, the shape of the chip region on the substrate cannot be inputted as image information.

In accordance with a third aspect of this invention, there is provided a periphery exposing apparatus for exposing a peripheral region around a chip region of a photosensitive layer applied to a substrate, in a staggered way along an outline of the chip region, comprising:

a substrate supporting mechanism for supporting the substrate;

a shape input unit for inputting shape information of the substrate and the chip region;

an image input unit for inputting, as image information, a shape of an area around a crossing point of scribe lines in the chip region on the substrate supported by the substrate supporting mechanism;

an exposure region computing unit for determining a position of the crossing point from the image information inputted, computing outline positions of the chip region from the position of the crossing point and the shape information, and computing positions of the peripheral region along the outline of the chip region from the outline positions of the chip region;

an irradiator for irradiating, with light, the photosensitive layer on the substrate supported by the substrate supporting mechanism;

a shifter for shifting the light of the irradiator relative to the photosensitive layer; and a control unit for controlling the shifter to shift the light of the irradiator based on the positions of the peripheral region data, thereby to expose the peripheral region.

A periphery exposing method executed by the above periphery exposing apparatus in accordance with the third aspect of this invention comprises the steps of:

(C-1) inputting shape information of the substrate and the chip region;

(C-2) inputting, as image information, a shape of an area around a crossing point of scribe lines in the chip region on the substrate supported by the substrate supporting mechanism;

(C-3) determining a position of the crossing point from the image information inputted at step (C-2) above, computing outline positions of the chip region from the position of the crossing point and the shape information inputted at step (C-1) above, and computing positions of the peripheral region along the outline of the chip region from the outline positions of the chip region; and (C-4) shifting light of the irradiator relative to the photosensitive layer on the substrate supported by the substrate supporting mechanism, based on the positions of the peripheral region computed at step (C-3) above, thereby to expose the peripheral region.

According to the periphery exposing apparatus and method of the third aspect of this invention, an inputted image of an area around a crossing point of scribe lines and shape information of the substrate and the chip region enable computation of the chip area, and then computation of positions of the peripheral area. Thus, the operator is not required to input position data of the peripheral region having a stepped, complicated shape along the outline of the chip area. In this way, operability is improved and the burden on the operator is reduced.

The image input unit may have an imaging region which is small but sufficient to pick up an image including at least one crossing point of scribe lines, to enable computation of the peripheral region to be exposed. Thus, the image input unit used may be small. Besides, by directly inputting an image of the substrate supported by the substrate supporting mechanism, the positions of the peripheral region may be computed with high precision to realize a high-precision exposure of the peripheral region.

As in the second aspect of the invention, the shifter of this periphery exposing apparatus may include an orthogonal shifter to expose the peripheral region in a staggered way. The shifter may include, as necessary, a rotating device for rotating the light of the irradiator relative to the photosensitive layer on the substrate supported by the substrate supporting mechanism and along an arcuate edge of the substrate. This construction allows the peripheral region to be exposed in two stages, i.e. exposure along the chip region and exposure along the arcuate edge of the substrate.

Where the shifter includes an orthogonal shifter, the axial directions of the scribe lines in the chip region (actually formed on the substrate supported by the substrate supporting mechanism) could be out of alignment with the axial directions of the orthogonal shifter. To cope with such a situation, the apparatus may further comprise an aligning device for deriving axial directions of the scribe lines in the chip region on the substrate supported by the substrate supporting mechanism, from the image information, and aligning the axial directions to axial directions of the orthogonal shifter. This construction permits an alignment between the axial directions of the scribe lines in the chip region (actually formed on the substrate supported by the substrate supporting mechanism) and the axial directions of the orthogonal shifter.

The periphery exposing apparatus in acordance with the third aspect of the invention may further comprise a rotating device for rotating the substrate supported by the substrate supporting mechanism, wherein the control unit effects controls such that the peripheral region is divided for exposure with each stepwise rotation by a predetermined degree. In this case, the peripheral region may be divided into a plurality of regions, and the substrate supported by the substrate supporting mechanism may be rotated intermittently by a predetermined angle, to expose one division after another. The shifter may have a diminished shifting range. Thus, the shifter may be formed compactly to miniaturize the apparatus. The periphery exposure may be effected for large substrates for the shifting range of the shifter.

In the periphery exposing apparatus in accordance with the third aspect of the invention, the shifter may be constructed to shift the light of the irradiator over an entire area of the photosensitive layer on the substrate supported by the substrate supporting mechanism. Step (C-3) of the above method may then be executed to; (i) determine a position of the crossing point from the image information inputted at step (C-2) above, (ii) compute outline positions of an entire area of the chip region from the position of the crossing point and the shape information inputted at step (C-1) above, and (iii) compute positions of an entire area of the peripheral region along the outline of the entire area of the chip region from the outline positions of the chip region. Step (C-4) may be executed to shift the light of the irradiator relative to an entire area of the photosensitive layer on the substrate supported by the substrate supporting mechanism, based on the positions of the entire area of the peripheral region computed at step (C-3) above, thereby to expose the peripheral region. In this case, peripheral exposure may be carried out while the substrate is not moving. This feature provides for a simplified construction and control of the periphery exposing apparatus, and a simplification of the periphery exposing method.

In the periphery exposing apparatus in accordance with the third aspect of the invention, as in the second aspect of the invention, the shifter may include an orthogonal shifter for shifting the light of the irradiator in two orthogonal directions relative to the photosensitive layer. The apparatus may further comprise a detector for detecting a reference position at an outer edge of the substrate supported by the substrate supporting mechanism, a position data input unit for inputting position data of the peripheral region along the outline of the chip region, and an aligning device for aligning axial directions of the position data and the orthogonal shifter based on results of detection provided by the detector. In this case, the control unit has an additional function for controlling the orthogonal shifter to shift the light of the irradiator along the peripheral region based on the position data. This construction allows a selection between the first periphery exposing method described hereinbefore and the third periphery exposing method. The peripheral region may be exposed by the first periphery exposing method where, for example, the shape of an area around a crossing point of scribe lines in the chip region on the substrate cannot be inputted as image information.

BRIEF DESCRIPTION OF THE DRAWINGS

For the purpose of illustrating the invention, there are shown in the drawings several forms which are presently preferred, it being understood, however, that the invention is not limited to the precise arrangements and instrumentalities shown.

DESCRIPTION OF THE PREFERRED EMBODIMENTS

Preferred embodiments of this invention will be described in detail hereinafter with reference to the drawings.

First Embodiment

Figure 1:
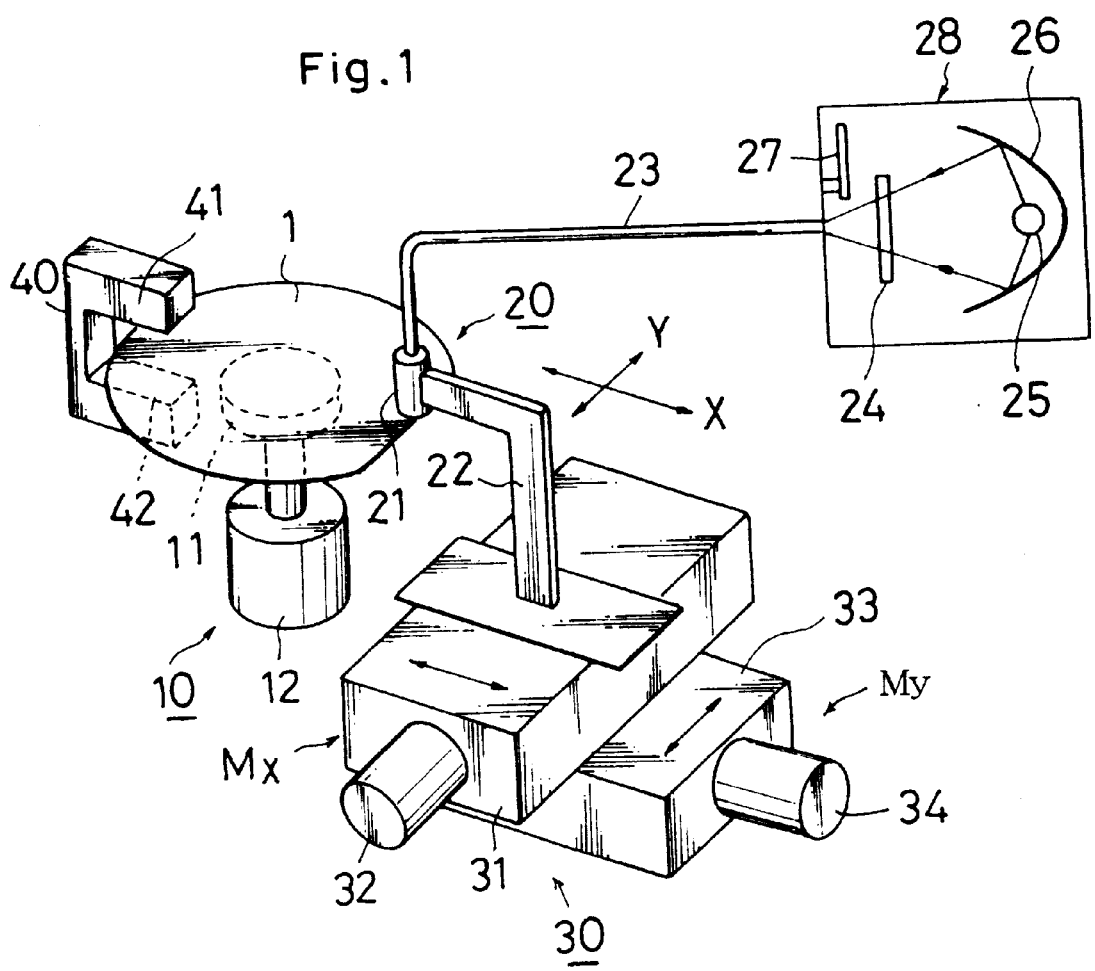
FIG. 1 is a schematic view of a periphery exposing apparatus in accordance with a first embodiment of this invention.

FIG. 1 shows a construction of a periphery exposing apparatus in accordance with a first embodiment of the invention.

The periphery exposing apparatus in accordance with the first embodiment includes a substrate spinner 10 for supporting and spinning a substrate or wafer 1, an irradiator 20 for irradiating and exposing peripheral regions of the wafer 1, a shifter 30 for shifting an irradiating position of light emitted from the irradiator 20, and a CCD line sensor 40 for detecting a reference position at an outer edge of the wafer 1.

The spinner 10 includes a spin chuck 11 for supporting the wafer 1 via suction at the lower surface thereof, and a motor (e.g. a stepper motor) 12 for rotating the spin chuck 11 on a rotary shaft.

Figure 2A:
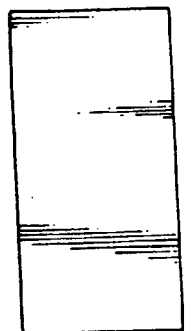
FIGS. 2A through 2C are views showing examples of spotlight shapes in accordance with the invention.
Figure 2B:
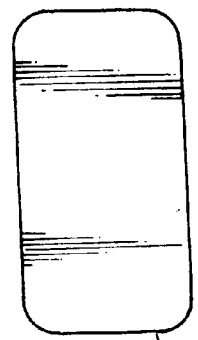
Figure 2C:
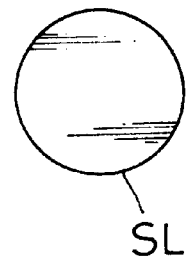

The irradiator 20 includes an exposing light source 28 for generating ultraviolet rays acting as exposing light, an optical fiber 23 for transmitting the ultraviolet rays from the exposing light source 28, and an irradiating tip 21 attached to a forward end of the optical fiber 23 for directing the ultraviolet rays to the upper surface of the wafer 1. The exposing light source 28 has a mercury xenon lamp 25, an elliptical mirror 26, an ultraviolet transmitting filter 24 and an open/close shutter 27. The irradiating tip 21 has a slit and lenses (not shown) for irradiating the wafer 1 with a spotlight restricted to a predetermined shape. As shown in FIG. 2A, the shape of the spotlight SL projected from the irradiating tip 21 to the wafer 1 may be rectangular (which may be oblong or square), rectangular with rounded corners (FIG. 2B) or circular (FIG. 2C). The rectangle having corners as shown in FIG. 2A is preferable with a view to a high-precision exposure of right-angled corners as described hereinafter.

The shifter 30 includes a support arm 22 for supporting the irradiating tip 21, a radial shifting unit Mx and a tangential shifting unit My for shifting the support arm 22 along an X-axis and a Y-axis extending perpendicular to each other. The radial shifting unit Mx has an X-table 31, reciprocable along the X-axis, a stepper motor 32 and a ball screw (not shown) for shifting the X-table 31. The tangential shifting unit My has a Y-table 33, reciprocable along the Y-axis, and a stepper motor 34 and a ball screw (not shown) for shifting the Y-table 33. The shifter 30 shifts the spotlight projected from the irradiating tip 21 in two orthogonal directions (along the X-axis and Y-axis) relative to a photosensitive layer formed on the upper surface of wafer 1 supported on the spin chuck 11.

The construction for shifting the spotlight projected from the irradiating tip 21 in two orthogonal directions (along the X-axis and Y-axis) is not limited to what is shown in FIG. 1. For example, the radial shifting unit Mx and tangential shifting unit My of FIG. 1 may be exchanged in their vertical arrangement. The substrate spinner 10 may be mounted on the radial shifting unit Mx and/or tangential shifting unit My, such that the wafer 1 is shifted along the X-axis and Y-axis relative to the spotlight from the irradiating tip 21.

The CCD line sensor 40 includes a light source 41 disposed above the wafer 1, and a photodiode 42 disposed below the wafer 1 and opposed to the light source 41.

Figure 3:
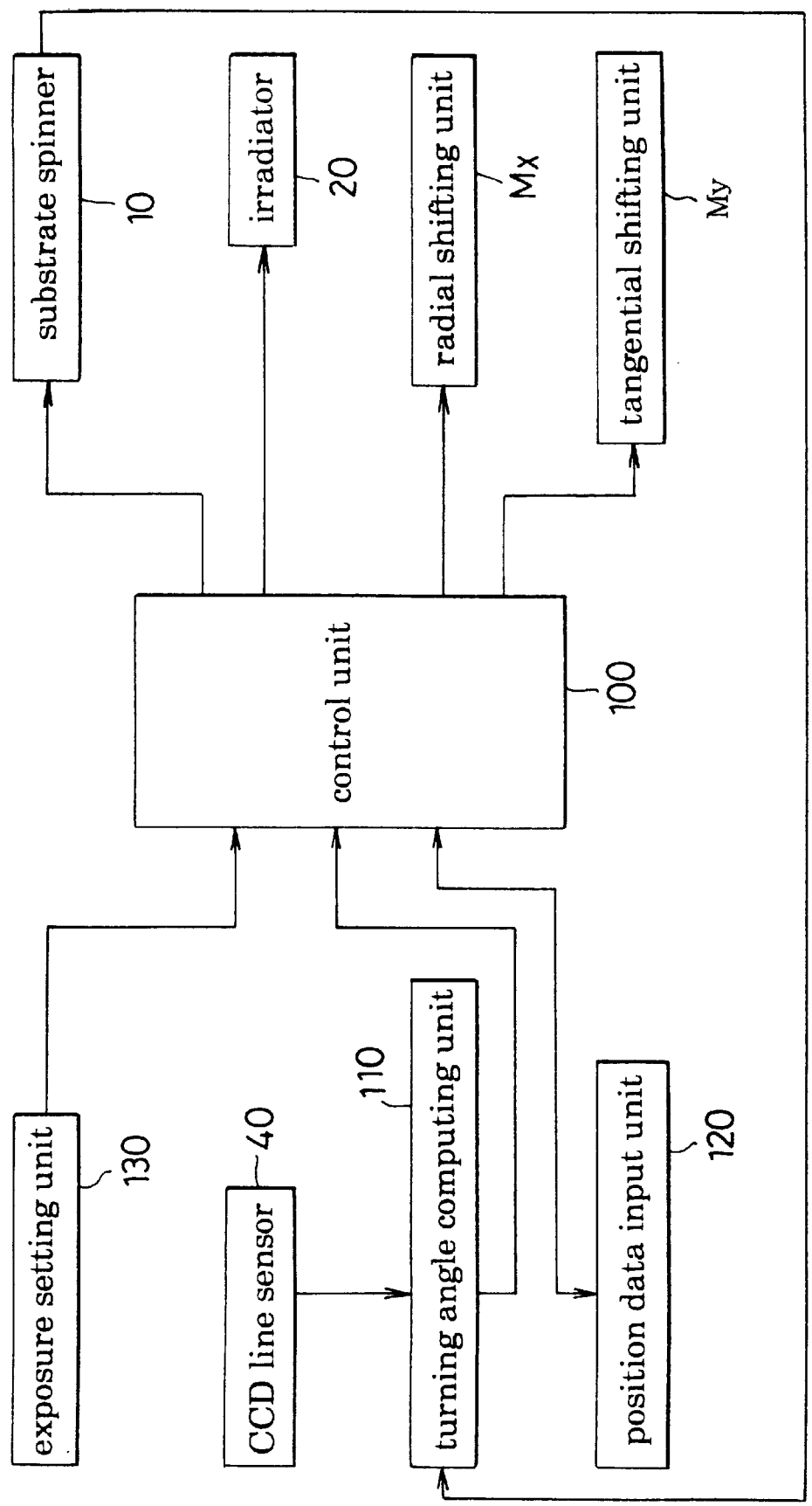
FIG. 3 is a block diagram showing a control system of the periphery exposing apparatus of FIG. 1.

Each component of the periphery exposing apparatus having the above construction is operable under control of a control unit. FIG. 3 is a block diagram showing a control system of the periphery exposing apparatus in accordance with the first embodiment of the invention. A control unit 100 controls a turning angle computing unit 110, a position data input unit 120, an exposure setting unit 130, a substrate spinner 10, an irradiator 20, a radial shifting unit Mx, and a tangential shifting unit My. The turning angle computing unit 110, derives angle information from an amount of rotation of the substrate spinner 10 (or motor 12), 10 which is variable from moment to by moment with the rotation thereof. The position data input unit 120 is used to input position data of a peripheral exposure region along an outline of a chip region. The exposure setting unit 130 is used to set an amount of exposure when exposing the peripheral exposure region.

The control unit 100 and turning angle computing unit 110 may be in the form of a personal computer, for example. The position data input unit 120 and exposure setting unit 130 may be in the form of a display and a keyboard. The operator may set position data of the peripheral exposure region through the keyboard or the like. Alternatively, position data of the peripheral exposure region may be transmitted from a host computer or other device (e.g. a stepper) through a communication medium.

A first periphery exposing method executed by the above apparatus of the first embodiment will now be described.

Figure 4:
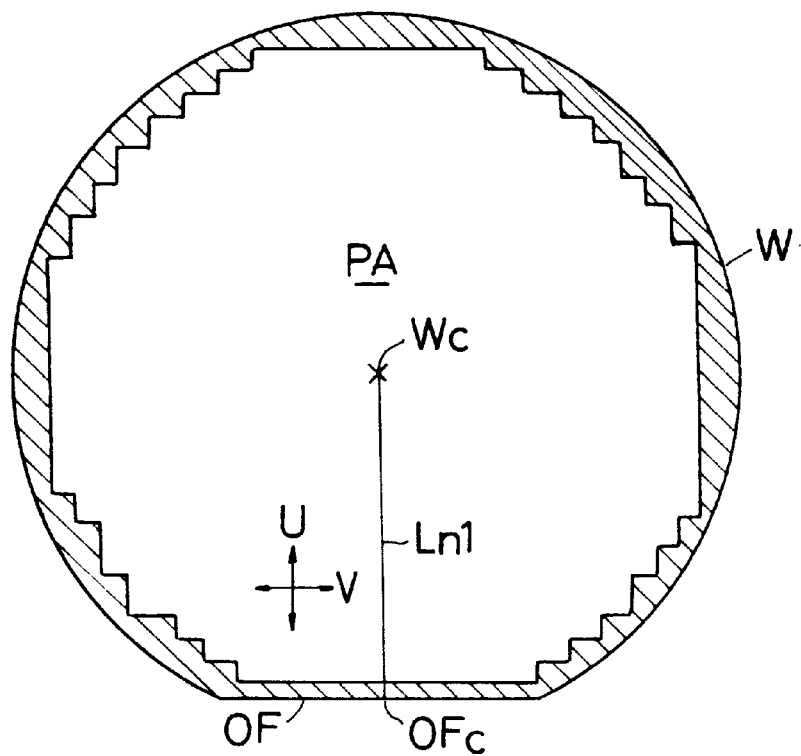
FIG. 4 is a view showing an example of an exposed peripheral region in accordance with the first embodiment of the invention.

FIG. 4 shows a peripheral region exposed by the first periphery exposing method. The peripheral exposure region (shown as hatching) is disposed outside a stepped or staggered outline of a chip region PA. The chip region PA is determined based on a reference position of the wafer 1 such as an orientation flat OF or a notch. FIG. 4 shows two orthogonal directions (U-axis and V-axis) extending along the stepped outline of the chip region PA. One of these directions (i.e. V-axis) extends parallel to the orientation flat OF. The following description will be made assuming that the wafer 1 has the orientation flat OF, but reference will be made to a wafer 1 having a notch when necessary.

Figure 5:
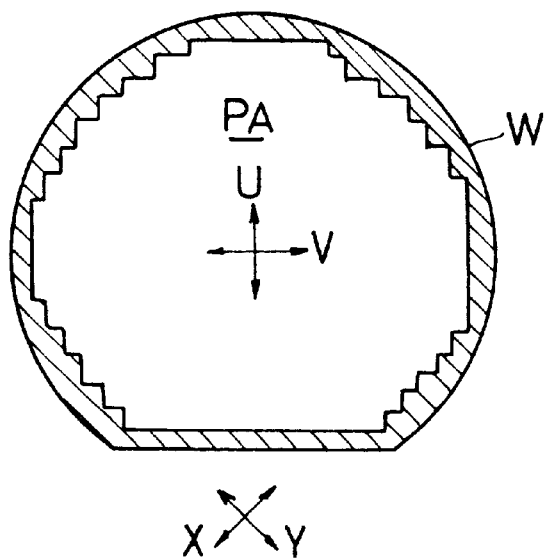
FIG. 5 is a view showing a disagreement between shifting directions of a shifter and directions along an outline of a chip region on a substrate.

With reference to FIGS. 1–5, the wafer 1 is placed on the spin chuck 11 by a transport mechanism (not shown). The substrate spinner 10 and shifter 30 are in a fixed relationship with each other. However, depending on a way the transport mechanism sets the wafer 1 onto the spin chuck 11, the orientation flat OF of the wafer 1 may be in such a positional relationship with respect to the shifter 30 that the U-axis and V-axis extending along the stepped outline of the chip region PA may be out of alignment with the X-axis and Y-axis of the shifter 30 (FIG. 5). The position data of the peripheral region are set with reference to the orientation flat OF (i.e. U-axis and V-axis). Thus, in the event of a misalignment between the UV-axes and XYaxes, the peripheral region cannot be exposed with high precision. Thus it is necessary to align the UV-axes and XY-axes. In the first periphery exposing method described hereinafter, this axial alignment is carried out which allows the peripheral region to be exposed with high precision.

Figure 6:
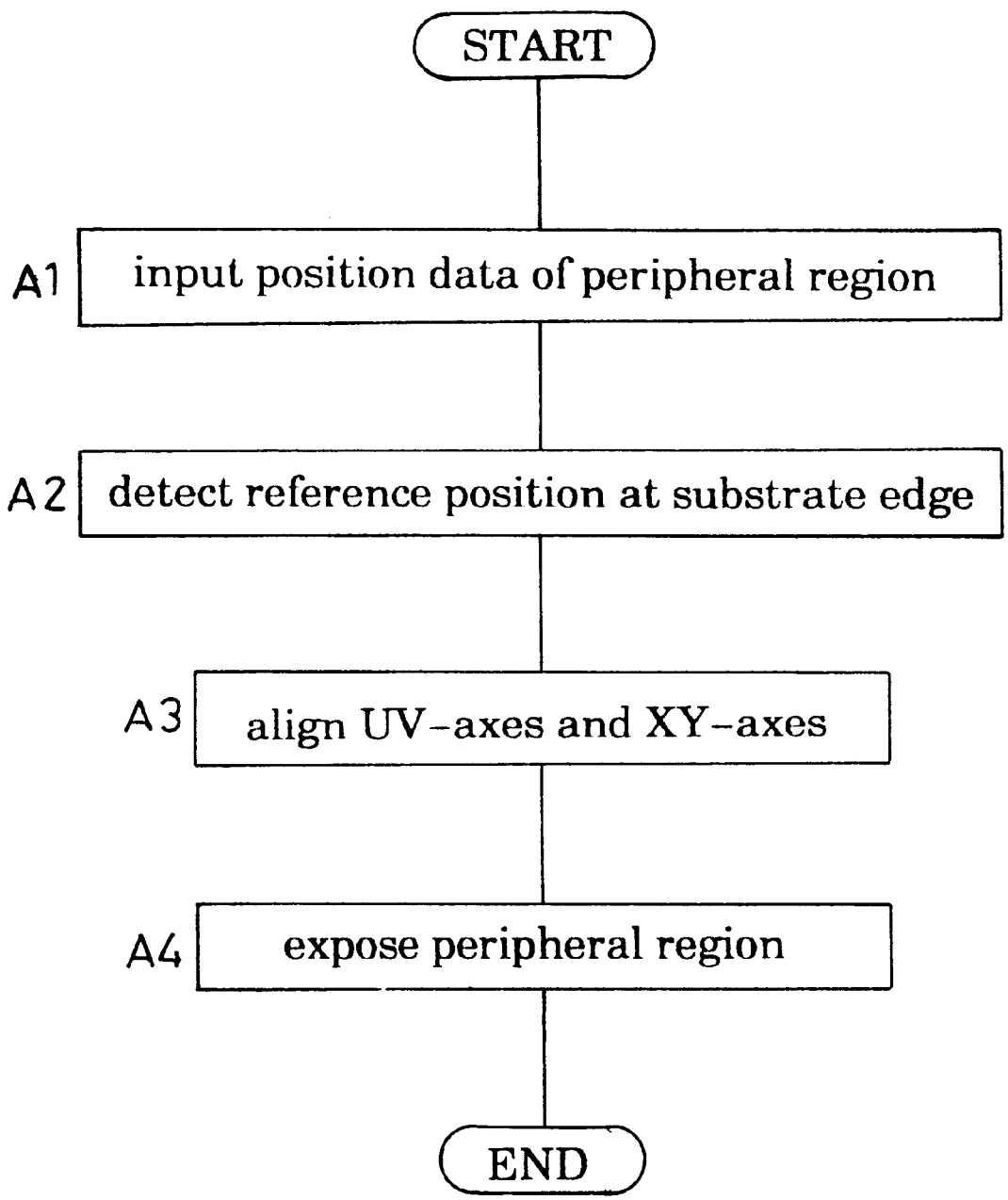
FIG. 6 is a flowchart showing a sequence of a first periphery exposing method in accordance with the invention.

FIG. 6 shows a sequence for performing the first periphery exposing method. First, the position data of the peripheral region are inputted by an operator a host computer, a stepper or the like (step A1). Next, the reference position such as the orientation flat OF or a notch at an outer edge of the wafer 1 is detected as described hereinafter (step A2). Based on a the detection result, the axial directions of the position data (UV-axes) and the shifting directions (XY-axis) of the shifter 30 are brought into alignment (step A3). Then, based on the position data inputted, the peripheral region is exposed as described hereinafter (step A4).

The processes of steps A2 and A3 will now be described in detail

First, the UV-axes and XY-axes may be aligned by detecting the orientation flat OF or the like, and rotating the substrate spinner 10 to set the orientation flat OF in position.

Figure 7A:
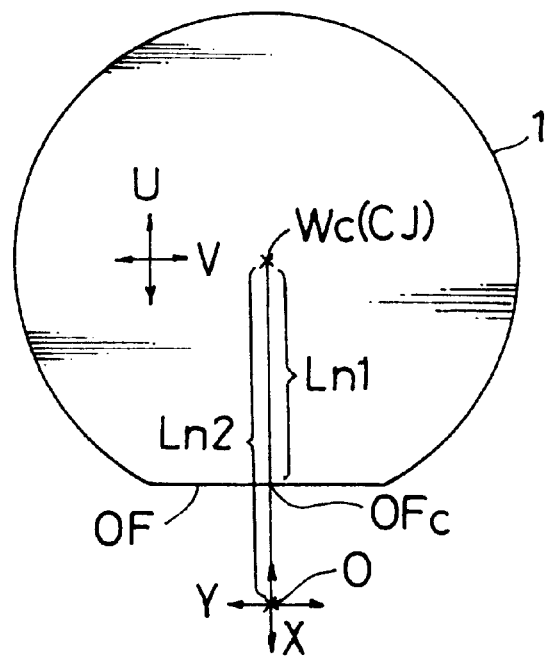
FIGS. 7A and 7B are explanatory views of an axis aligning method in accordance with the invention.
Figure 7B:
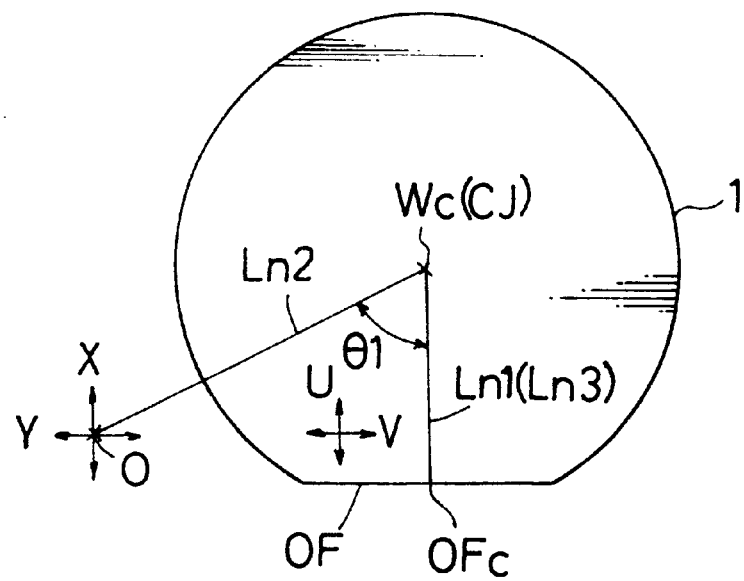

The positional relationship between the substrate spinner 10 and shifter 30 is known. Therefore, in the example shown in FIG. 4, the orientation flat OF may be positioned so that a line Lnl between the center Wc of the wafer 1 and the middle OFc of the orientation flat OF extends parallel (or perpendicular) to one of the shifting directions (X-axis or Y-axis) of the shifter 30. FIG. 7A shows an example of the positional relationship between the origin of movement O of the shifter 30 (which is set to an appropriate position within a shifting range along the X-axis and Y-axis of the shifter 30) and the spin center CJ of the substrate spinner 10 (spin chuck 11). The orientation flat OF may be positioned so that a line Ln2 between the origin of movement O and the spin center CJ concur with (or extend perpendicular to) the above-mentioned line Lnl. In FIG. 7A, the wafer 1 is supported by the spin chuck 11, with the center Wc of wafer 1 concurring with the spin center CJ of spin chuck 11. If the center Wc of wafer 1 is displaced from the spin center CJ of spin chuck 11, the orientation flat OF may be positioned so that the line Ln2 extends parallel (or perpendicular) to the line Lnl. If the origin of movement O and the spin center CJ are in a positional relationship as shown in FIG. 7B, the orientation flat OF may be positioned so that the line Ln2 is rotated counterclockwise through a known angle θ1 (or clockwise through an angle 90°-θ1) about the spin center CJ to concur with the line Lnl as line Ln3 (when the center Wc of wafer 1 and the spin center CJ are in alignment), or to be parallel (or perpendicular) to the line Lnl (when the center Wc of wafer 1 and the spin center CJ are out of alignment).

For a wafer 1 having a notch, axial alignment may be established in the same way as for the wafer 1 having the orientation flat OF.

The middle OFc of orientation flat OF is detected by using the CCD line sensor 40 and the turning angle computing unit 110 as follows.

The motor 12 is driven to rotate the spin chuck 11 about the spin center CJ. Variations in the number of cells turned "ON" in outputted from the CCD line sensor 40 are monitored. The CCD line sensor 40 has portions thereof overhanging the wafer 1. If, for example, the spin center CJ and the center Wc of wafer 1 are in register, the number of cells in an "ON" state does not vary while the CCD line sensor 40 is traversing an arc of the spinning wafer 1 in a spin. The number of cells in the "ON" state begins to increase the moment the CCD line sensor 40 passes one end OFe (FIG. 8) of orientation flat OF. The increase in the number of cells in the "ON" state enables the detection of the one end OFe (FIG. 8) of orientation flat OF. With further rotation of the spin chuck 11, the number of "ON" cells continues to increase until the moment the CCD line sensor 40 passes the middle OFc of orientation flat OF is reached. After the middle OFc of orientation flat OF, the number of "ON" cells begins to decrease. When the CCD line sensor 40 passes the other end OFe of orientation flat OF, the number of "ON" cells remains constant. The detection of a constant number of "ON" cells enables the detection of the other end OFe of orientation flat OF.

Figure 8:
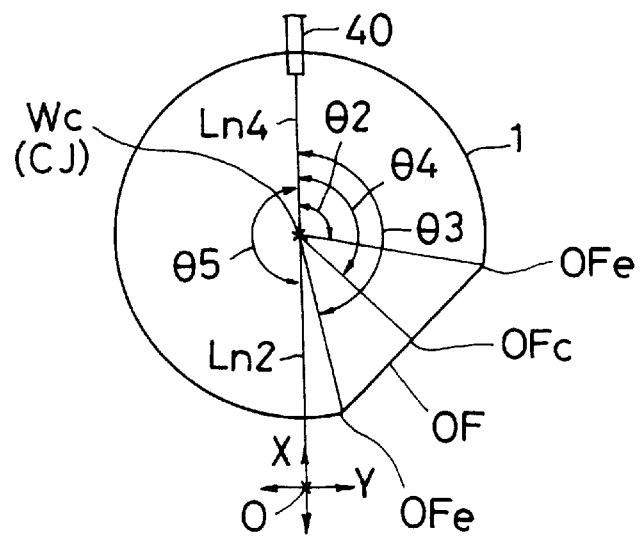
FIG. 8 is an explanatory view of a method of detecting a middle position of an orientation flat to enable an axial alignment in accordance withthe invention.

Assume, for example, that the angle information from the turning angle computing unit 110 is 0° for a start of rotation of the spin chuck 11. Then, the degrees of rotation at which the opposite ends OFe of orientation flat OF are detected by CCD line sensor 40 may be determined from the angle information provided by the turning angle computing unit 110 when the opposite ends OFe of orientation flat OF are detected. When these angles are θ2 and θ3 as shown in FIG. 8, the angle θ4 at which the CCD line sensor 40 passes the middle OFc of orientation flat OF may be derived from the equation θ4={(θ3–θ2)/2}+θ2. The positional relationships among the CCD line sensor 40, the spin center CJ of spin chuck 11 and the origin of movement O of shifter 30 is known. Therefore, an angle θ5 between a line Ln4 linking the CCD line sensor 40 and spin center CJ and the line Ln2 is known. The angle θ5 and the angle θ4 derived above are used to enable the positional adjustment of orientation flat OF and the alignment of UV-axes and XY-axes shown in FIGS. 7A and 7B.

If the center Wc of wafer 1 is displaced from the spin center CJ, the number of "ON" cells of the CCD line sensor 40 describes a sine curve while an arcuate peripheral region moves past the CCD line sensor 40 during a rotation of the spin chuck 11. While the orientation flat OF moves past the CCD line sensor 40, the number of "ON" cells changes which dent the sine curve. The turning angle θ4 of the middle OFc of orientation flat OF may be determined from angle information gathered on the dented portion.

When a notch is used on the wafer 1 as with the orientation flat OF, the number of "ON" cells of the CCD line sensor 40 changes while the notch moves past the CCD line sensor 40 during rotation of the spin chuck 11. The middle of the notch may be determined from this change.

After the alignment has been made as described above, step A4 of periphery exposure is executed as follows.

Figure 9:
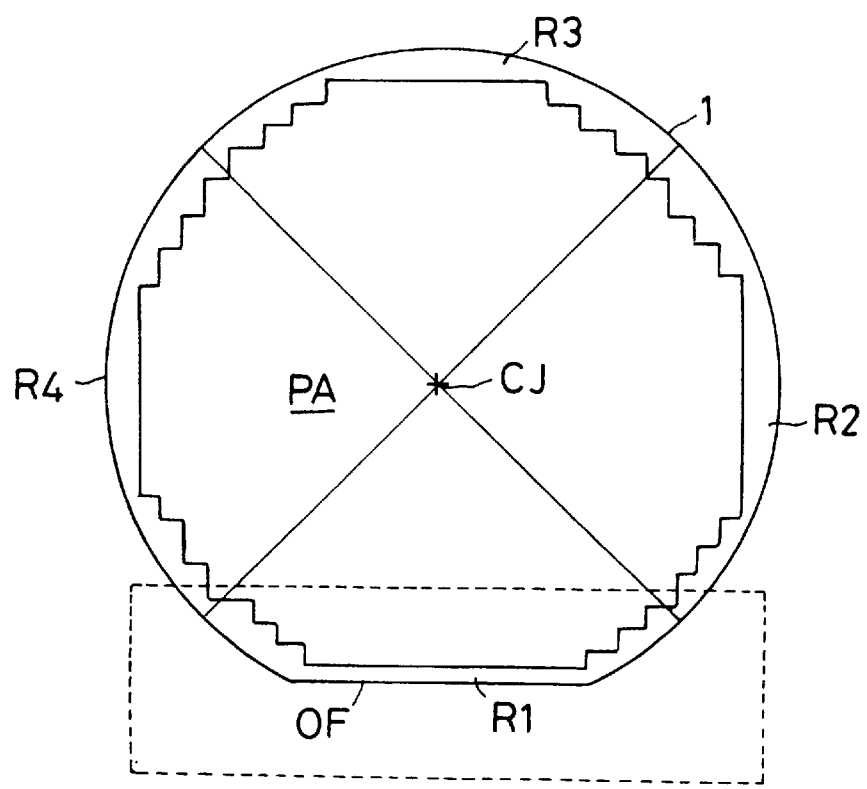
FIG. 9 is a view showing divided exposure regions in accordance with the invention.

As shown in FIG. 9, the peripheral exposure region is divided every 90° about the spin center CJ of spin chuck 11 into four regions RA1–RA4. In the following description, one divided region or division is exposed after another. The shifting range in the two orthogonal directions of the shifter 30 is set to a range for allowing the spotlight to be shifted in each division as shown in a dotted line in FIG. 9. After one division is exposed, the spin chuck 11 is rotated 90° to move the next division into the shifting range in the two orthogonal directions of the shifter 30. This operation is repeated to expose all of the divisions.

Figure 10:
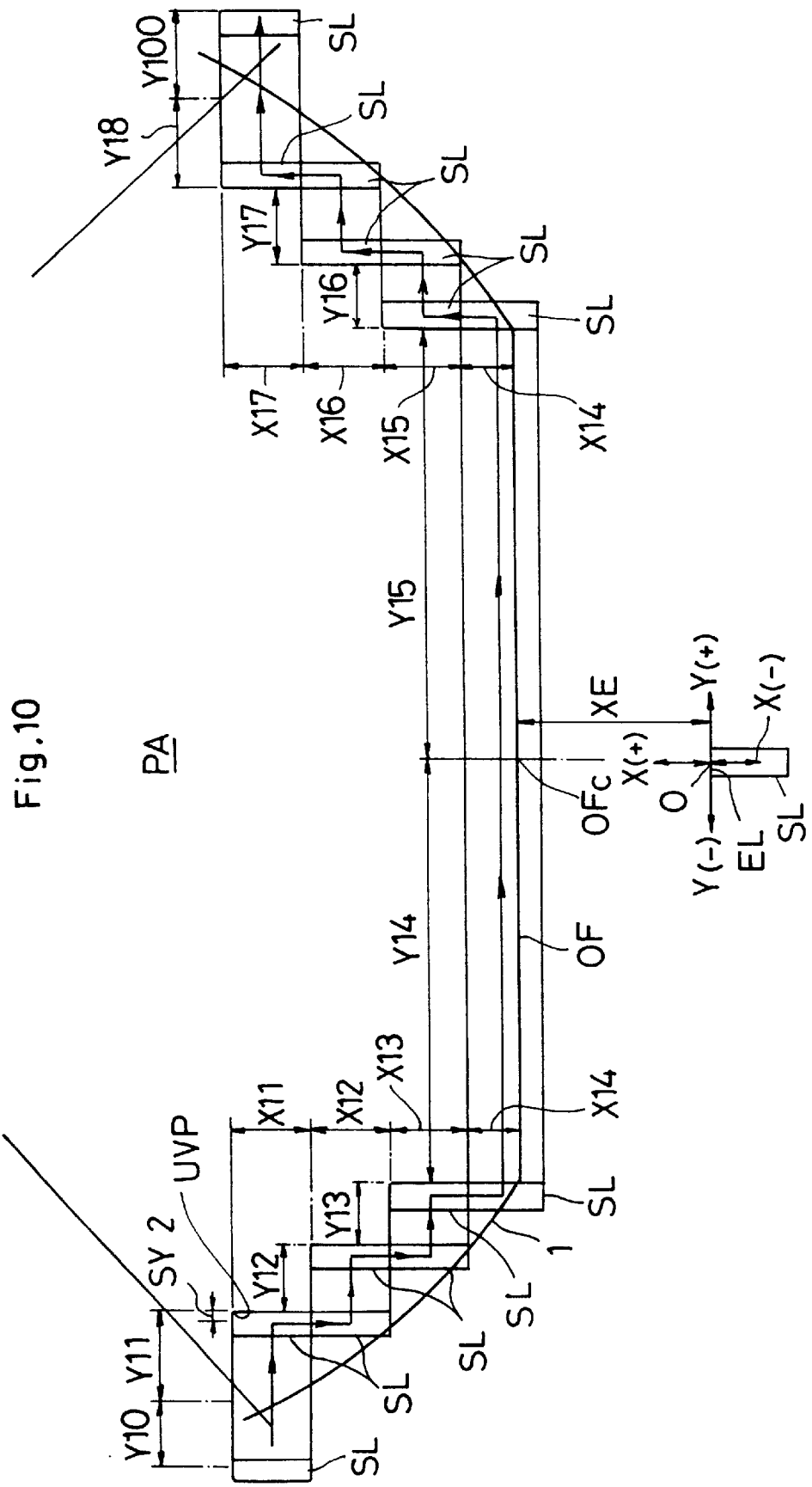
FIG. 10 is a view showing an exposing operation performed by shifting a spotlight in two orthogonal directions based on position data in accordance with the invention.

The position data of the peripheral exposure region inputted are as shown in FIG. 10, for example. It is assumed that the origin of movement O of the shifter 30 is set to the position shown in FIG. 10. It is further assumed that, as shown in FIG. 10, the spotlight SL projected from the irradiating tip 21 has a middle point on an edge EL thereof coinciding with the origin of movement O at the level of wafer 1. For expediency, the X-axis and Y-axis have (+) and (–) directions as illustrated, respectively.

Figure 11:
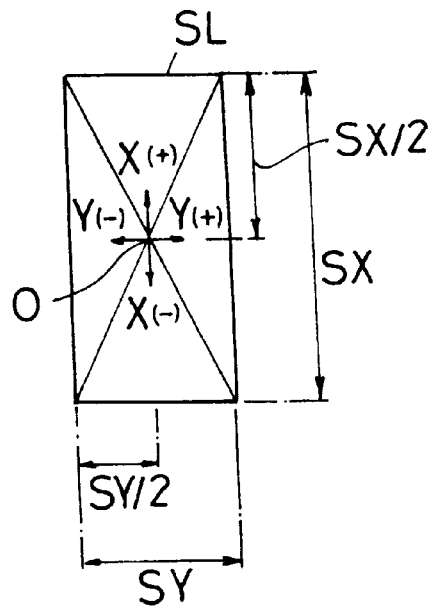
FIG. 11 is an explanatory view showing a way of setting an origin of movement in accordance with the invention.

First, the light source 25 is turned on and the shutter 27 is closed. The irradiating tip 21 is then shifted from the origin O by an amount (XE+X14+X13+X12+X11) in the (+) direction of X-axis, and then by an amount (Y14+Y13+Y12+Yl1+Y10) in the (–) direction of Y-axis. Next, the shutter 27 is opened to emit the spotlight SL. In this state, the irradiating tip 21 (spotlight SL) is shifted by an amount (Y10+Y11-(SY/2)) in the (+) direction of Y-axis, and then by an amount (X11) in the (–) direction of X-axis. At this time, a right-angled portion UVP may be exposed with high precision if the spotlight SL is shaped with rectangular corners. The adjustment by SY/2 above is made since the spotlight SL is shifted from the position in which the middle point on its edge EL coincides with the origin of movement 0 at the level of wafer 1. The adjustment by SY/2 is unnecessary if this adjustment is already included in the position data for the directions along the Y-axis. If the operation is started from a state where the center point of the spotlight coincides with the origin O as shown in FIG. 11, an adjustment by SX/2 may be made in shifting along the X-axis also. References SX and SY denote dimensions along the X-axis and Y-axis of the spotlight SL which are known.

Subsequently, the spotlight SL is shifted along the X-axis and Y-axis to effect linear exposure based on the position data, as indicated by arrows in FIG. 10. Then, the shutter 27 is closed. During the above exposing operation, the spotlight SL is shifted at a speed adjusted to achieve the exposure determined by the exposure setting unit 130.

Next, the spin chuck 11 is rotated 90° clockwise in FIG. 9 to move the second division RA2 into the shifting range of the shifter 30 indicated by the dotted line in FIG. 9. As is the division RA1, the second division RA2 is exposed based on position data of the division RA2. Thereafter, the third division RA3 and fourth division RA4 are successively exposed in the same way. Alternatively, the spin chuck 11 may be rotated counterclockwise in FIG. 9 to expose the divisions in the order of RA1, RA4, RA3 and RA2. The shutter 27 is closed upon completion of exposure of each division RA1–RA4 to avoid wasteful exposure while the wafer 1 is in rotation. As described above, the first division RAl is exposed by shifting the irradiating tip 21 in the (+) direction of Y-axis (i.e. from left to right of wafer 1 in FIG. 10). Consequently, when the exposure of the first division RA1 is completed, the irradiating tip 21 is situated at the (+) side of Y-axis (at the righthand side of wafer 1). Throughput would be low if the second division RA2 were exposed by shifting the irradiating tip 21 in the (+) direction of Y-axis after returning it in the (–) direction of Y-axis. Therefore, the second division RA2 is exposed linearly by shifting the irradiating tip 21 from the (+) side to the (–) side of Y-axis to promote improved throughput. Similarly, the third division RA3 is exposed by shifting the irradiating tip 21 from the (–) side to the (+) side of Y-axis. The fourth division RA4 is exposed by shifting the irradiating tip 21 from the (+) side to the (–) side of Y-axis.

In this way, periphery exposure is carried out with high precision along the stepped outline of the chip region PA.

Figure 12:
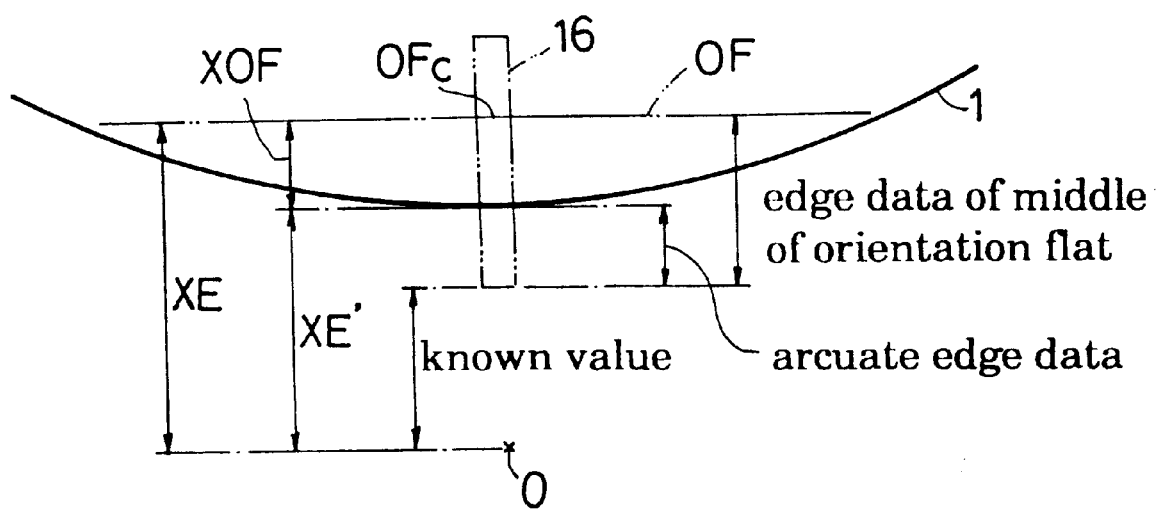
FIG. 12 an explanatory view showing a way of determining distances from the origin of movement to edges of a wafer in accordance with the invention.

In FIG. 10, XE has a value determined from the size of wafer 1 (radius: XE') and XOF (which is a maximum width at the middle OFc of orientation flat OF). For exposing the peripheral regions of wafers 1 having the same shape, values of XE, XE' and XOF according to the shape of wafers 1 may be stored in advance. The values of XE, XE' and XOF may be inputted to the control unit 100 as necessary. Position data of peripheries (i.e. edge data) of wafer 1 may be collected through the CCD line sensor 40 by rotating the spin chuck 11 360° to be stored along with angle information, and the values of XE, XE' and XOF may be derived from the edge data. The positional relationship between the origin of movement O and the CCD line sensor 40 is known. Therefore, the above XE, XE' and XOF may be derived from the edge data as shown in FIG. 12. Where the above alignment is carried out, the edge data may be collected in parallel with detection of the middle OFc of orientation flat OF for the alignment.

Reference Y10 in FIG. 10 denotes an appropriate distance for establishing an exposure starting position of spotlight SL outside the wafer 1. Reference Y100 is an appropriate distance for establishing an exposure finishing position of spotlight SL outside the wafer 1.

Figure 13A:
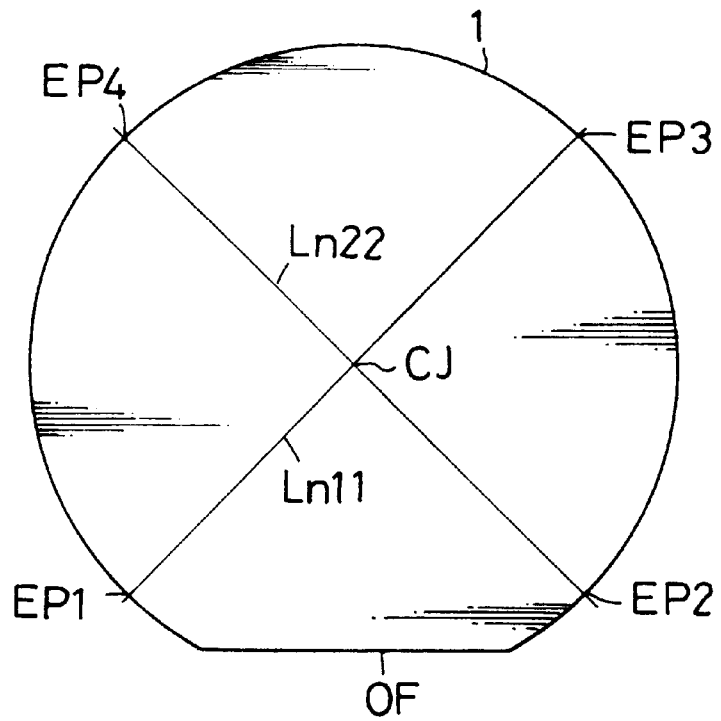
FIGS. 13A and 13B are explanatory views showing a way of adjusting a displacement between a rotary shaft and the center of a wafer in accordance with the invention.
Figure 13B:
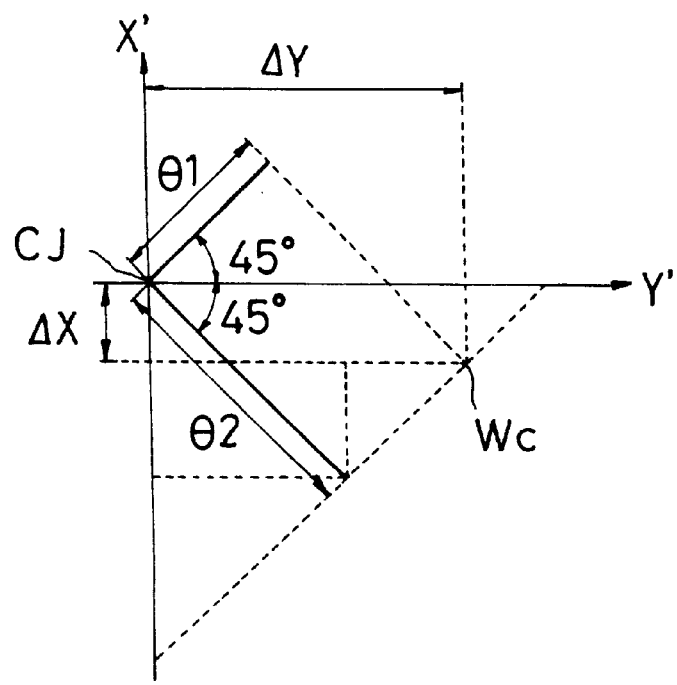

If the center Wc of wafer 1 is displaced from the spin center CJ of spin chuck 11, the shifting along the X-axis and Y-axis should be adjusted according to an amount of displacement. For this purpose, edge data are collected from edge positions EP1–EP4 arranged at intervals of 90° as shown in FIG. 13A, for example. These edge data are used to determine displacements along a line Ln11 extending between positions EP1 and EP3 and along a line Ln12 extending between positions EP2 and EP4. Then, as shown in FIG. 13B, displacements along the X-axis and Y-axis are calculated from displacements Q1 and Q2 along the lines Ln11 and Ln12 by using trigonometric functions, for example. Displacements ΔX and ΔY along the X-axis and Y-axis may be added or subtracted when shifting the spotlight SL along the X-axis and Y-axis. The X'-axis and Y'-axis shown in FIG. 13B are axes extending parallel to the X-axis and the Y-axis, respectively.

Figure 14:
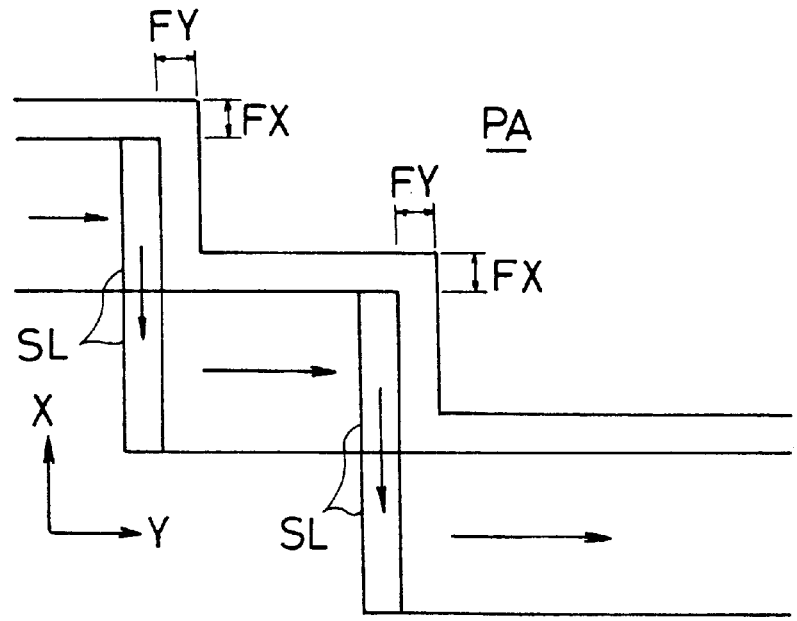
FIG. 14 is an explanatory view showing a way of exposing peripheries with a frame formed around the chip region in accordance with the invention.

When effecting a linear exposure with a frame of predetermined width around the chip region PA, as shown in FIG. 14, the X-axis and Y-axis may be shifted by taking account of widths FX and FY along the X-axis and Y-axis. If the position data already include the frame, then exposure may be carried out based on the position data.

Figure 15:
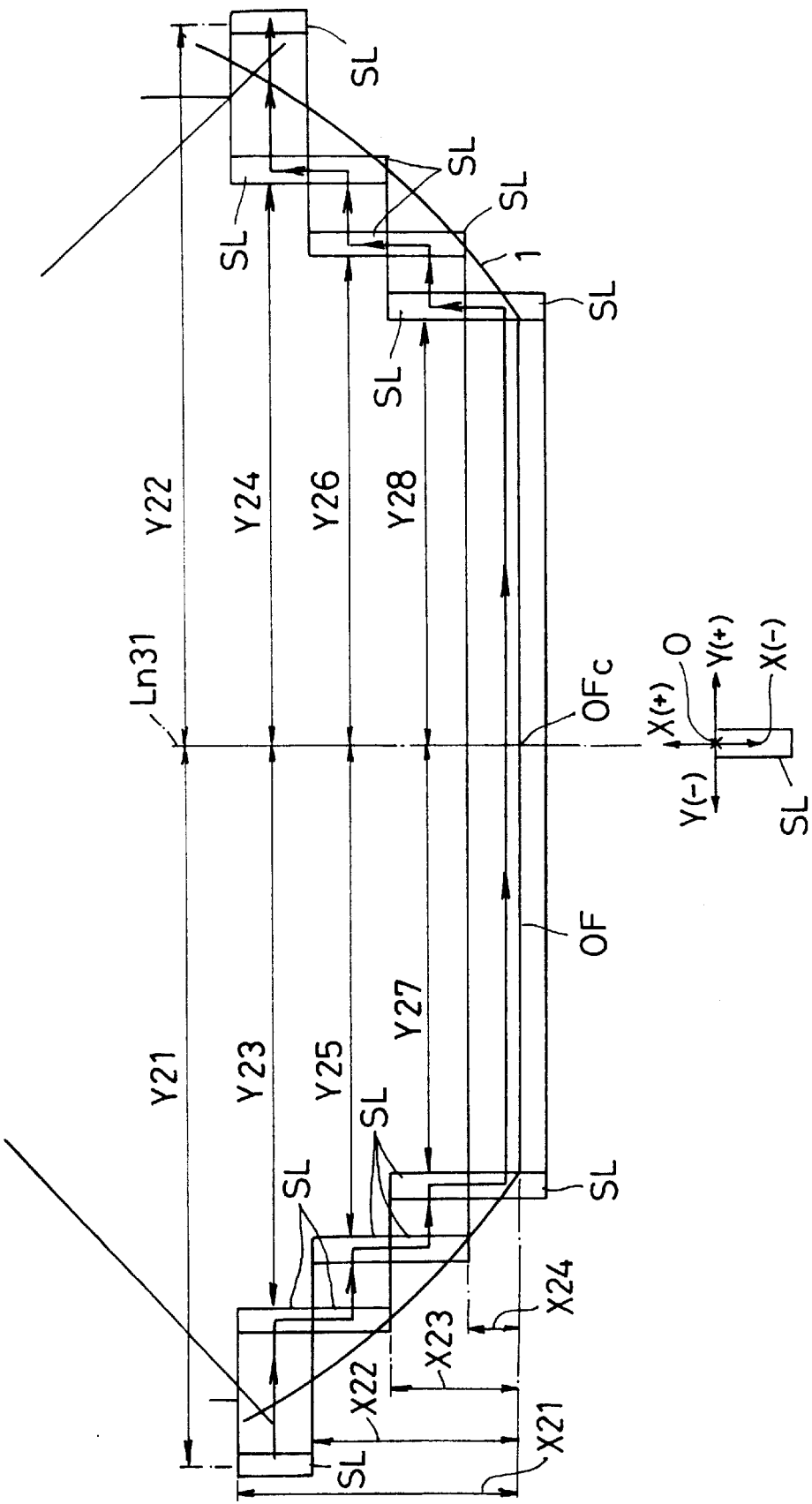
FIG. 15 is an explanatory view showing another way of setting position data in accordance with the invention.

The position data may be inputted as shown in FIG. 15 and in the following form, for example, which are analyzed by the control unit 100 to shift the irradiating tip 21 as described above:

exposing range non-exposing range exposing width

−Y21 to +Y22 −Y23 to +Y24 X21

−Y23 to +Y24 −Y25 to +Y26 X22

−Y25 to +Y26 −Y27 to +Y28 X23

−Y27 to +Y28 none X24

The above data form pertains to the division RA1, and a similar form is applicable to the other divisions RA2–RA4. In the above form, the exposing range and non-exposing range represent shifting information for the directions along the Y-axis, and the exposing width represents shifting information for the directions along the X-axis. The above data include ranges to be exposed and not to be exposed in directions along the Y-axis. For the division RA1 (FIG. 15), the exposing widths are taken from the middle OFc of orientation flat OF. For the divisions RA2–RA4, the exposing widths are taken from an intersection between a straight line extending in the (+) direction of X-axis from the origin of movement O and an arcuate edge. For divisions RA1–RA4, point "0" in the direction along the Y-axis is located on a straight line Ln31 extending in the (+) direction of X-axis from the origin of the movement O.

The position data inputted may also include coordinates of spotlight turnback positions, for example.

Figure 16:
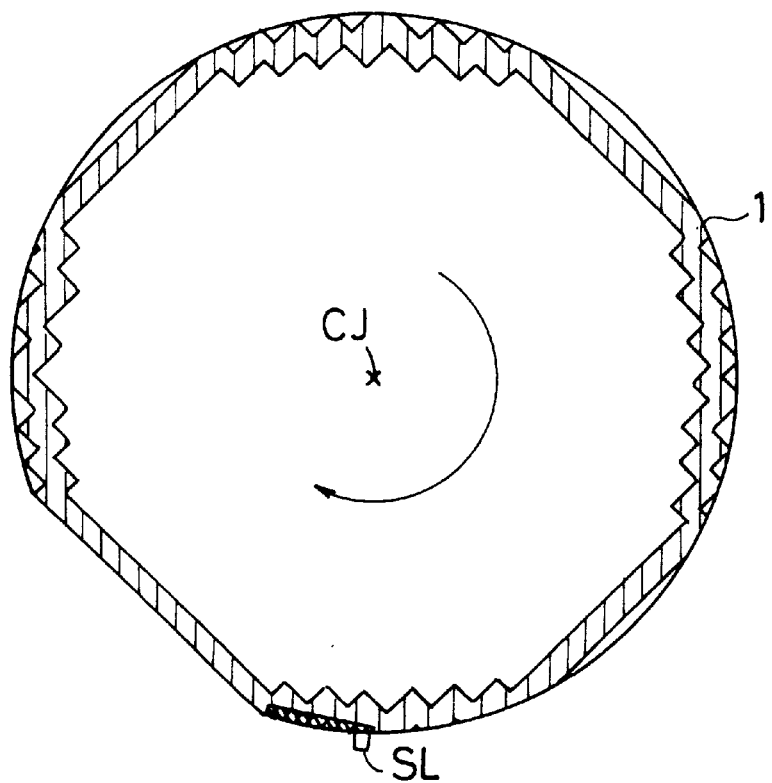
FIG. 16 is a view showing a step of exposing areas remaining unexposed after an exposure in accordance with the invention.

After the peripheral region is exposed along its boundary adjoining the chip region PA based on the position data, unexposed areas may remain outside the exposed region as shown in FIG. 16. In this case, the spin chuck 11 is rotated with the peripheries of wafer 1 irradiated by the spotlight SL having a predetermined exposing width. As a result, the peripheries including the unexposed areas of wafer 1 are exposed in a ring form as shown in hatching in FIG. 16. For irradiating the peripheries of wafer 1 with the spotlight SL according to the exposing width, the irradiating tip 21 may be adjusted along the Y-axis and shifted along the X-axis radially of with respect to wafer 1. For example, the irradiating tip 21 may be shifted in the (+) direction of the X-axis by an amount XE or XE'+ exposing width. The exposing width may be varied at each appropriate rotating angle according to the size and shape of each unexposed area. The areas left unexposed after the exposure based on the position data may be calculated from the size of wafer 1, a maximum width of orientation flat OF (or edge data), and a shifting path of the spotlight SL based on the position data. Exposing width data (which may be data for each rotating angle) for the spin exposure of wafer 1 may be inputted separately to the control unit 100.

The exposing step executed by shifting the spotlight SL along the arcuate edge of wafer 1 may precede the exposure based on the above position data.

Figure 17:
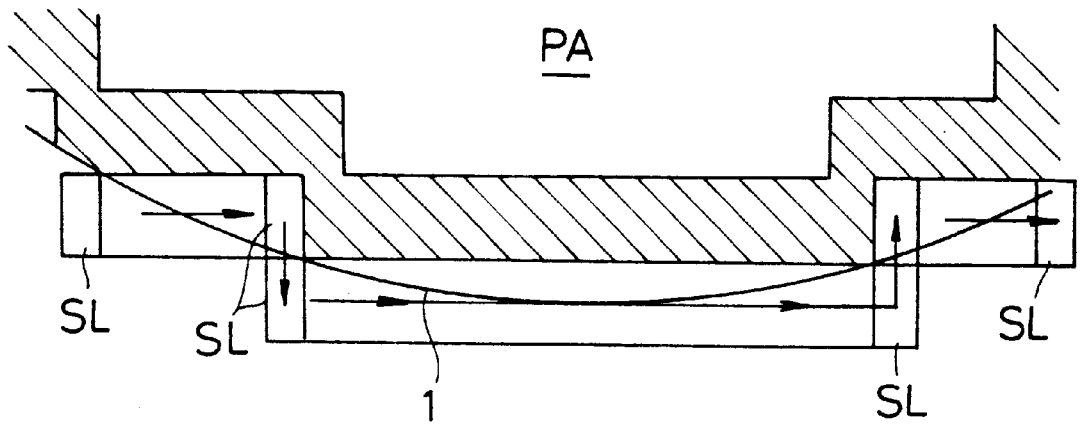
FIG. 17 is a view showing a different way of exposing the areas remaining unexposed after the exposure based on the position data in accordance with the invention.
Figure 18:
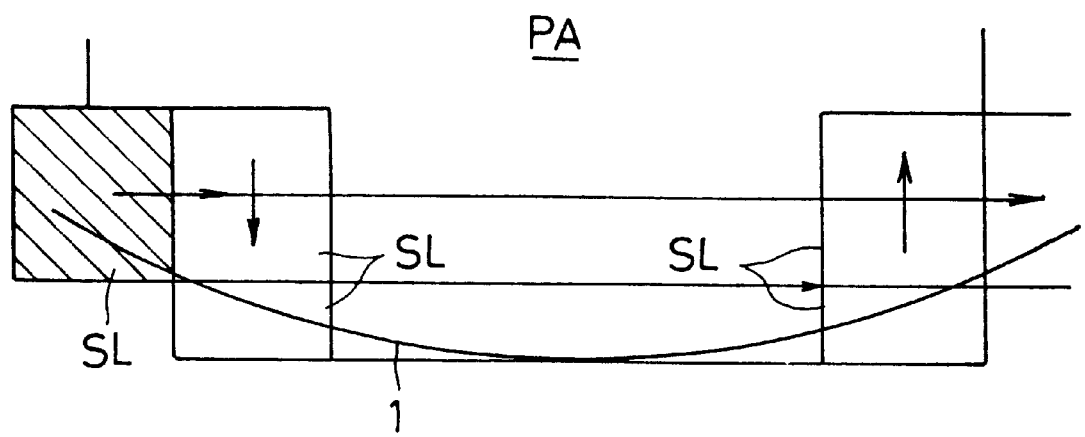
FIG. 18 is a view showing a way of exposing peripheries based on the position data without leaving unexposed areas in accordance with the invention.

The areas remaining unexposed after the exposure based on the position data may also be exposed linearly in a separate step as shown in FIG. 17. That is, the spotlight SL is shifted as indicated by arrows in FIG. 17, to expose the unexposed areas. In FIG. 17, the hatched portion represents the region exposed based on the above position data. In the example shown in FIG. 10 and other figures, the spotlight SL has a relatively small size, so that unexposed areas remain after the exposure based on the position data. Where, as shown in FIG. 18, the spotlight SL has a large size (shown in hatching), no area will be left unexposed after the exposure based on the position data. In this case, the exposing process shown in FIG. 16 or FIG. 17 is not required. What is shown in FIGS. 16 through 18 is applicable also to the other embodiments described hereinafter.

The foregoing embodiment includes one set of irradiator 20 (irradiating tip 21) and shifter 30 for successively exposing the first to fourth divisions RA1–RA4 of wafer 1 which is rotated intermittently through 90° each. Sets of irradiators 20 (irradiating tip 21) and shifters 30 corresponding in number (which is four in the foregoing embodiment) to the divisions may be provided. The, throughput may be improved by exposing the first to fourth divisions RA1–RA4 simultaneously by using the respective irradiator 20 (irradiating tip 21) and shifter 30.

In the foregoing embodiment, the processes at steps A2 and A3 and the annular exposure of predetermined exposing width (included in the process at step A4) shown in FIG. 16 are executed by rotating the wafer 1 relative to the CCD line sensor 40 and irradiating tip 21. Instead, the COD line sensor 40 and irradiating tip 21 may be shifted along the edge of wafer 1 which is not moved.

Where plural sets of irradiating tips 21 and shifters 30 are provided to perform the annular exposure of predetermined exposing width shown in FIG. 16 each irradiating tip 21 may be shifted along the edge of wafer 1 which is not moved. In this case, each irradiating tip 21 is shifted through 90° where four irradiating tips 21 are provided.

The number of divisions of the peripheral exposure region is not limited to four, but may be two, for example.

Figure 19A:
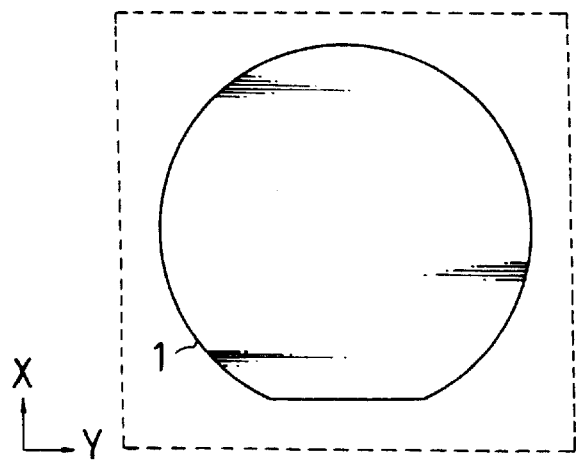
FIGS. 19A and 19B are views showing shifting ranges of the shifter not requiring a divisional exposure in accordance with the invention.
Figure 19B:
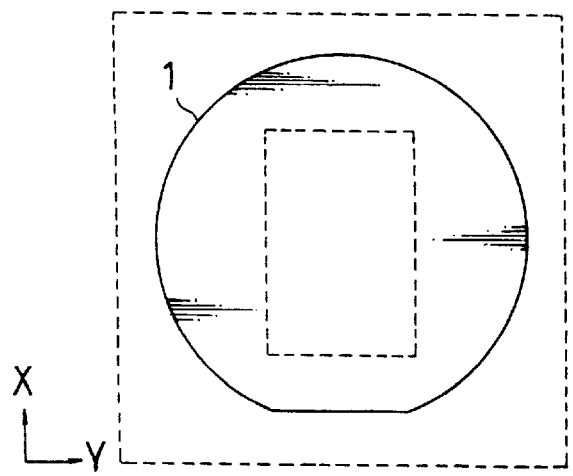

The shifter 30 may be constructed to shift the spotlight in two orthogonal directions in a range covering the entire wafer 1 as shown in a dotted line in FIG. 19A or in a range covering the entire wafer 1 excluding a center region as shown in dotted lines in FIG. 19B. Then, of course, the peripheral region need not be divided for exposure as in the. foregoing embodiment. However, such a shifter 30 is large, complicated, and results in an enlarged construction of the apparatus. Where, as in the foregoing embodiment, the peripheral region is divided for exposure, the shifter 30 may be compact and the apparatus may be small and simple.

Figure 20:
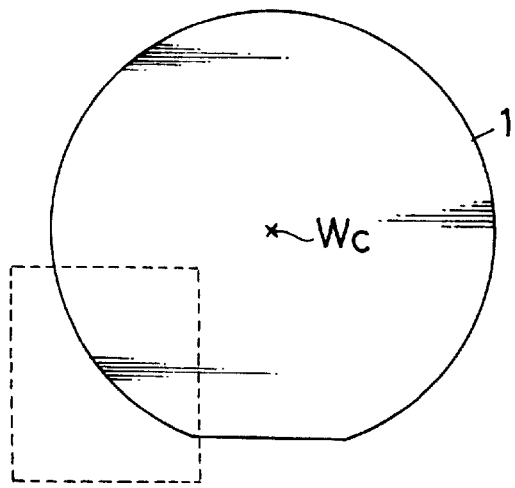
FIG. 20 is a view showing a modified shifting range of the shifter in accordance with the invention.

In the foregoing embodiment and its modifications, the shifts along the X-axis include shifts made radially of wafer 1. As shown in FIG. 20, for example, the shifter 30 may shift the spotlight within a range (shown in a dotted line) not including a radial shift.

Second Embodiment

Figure 21:
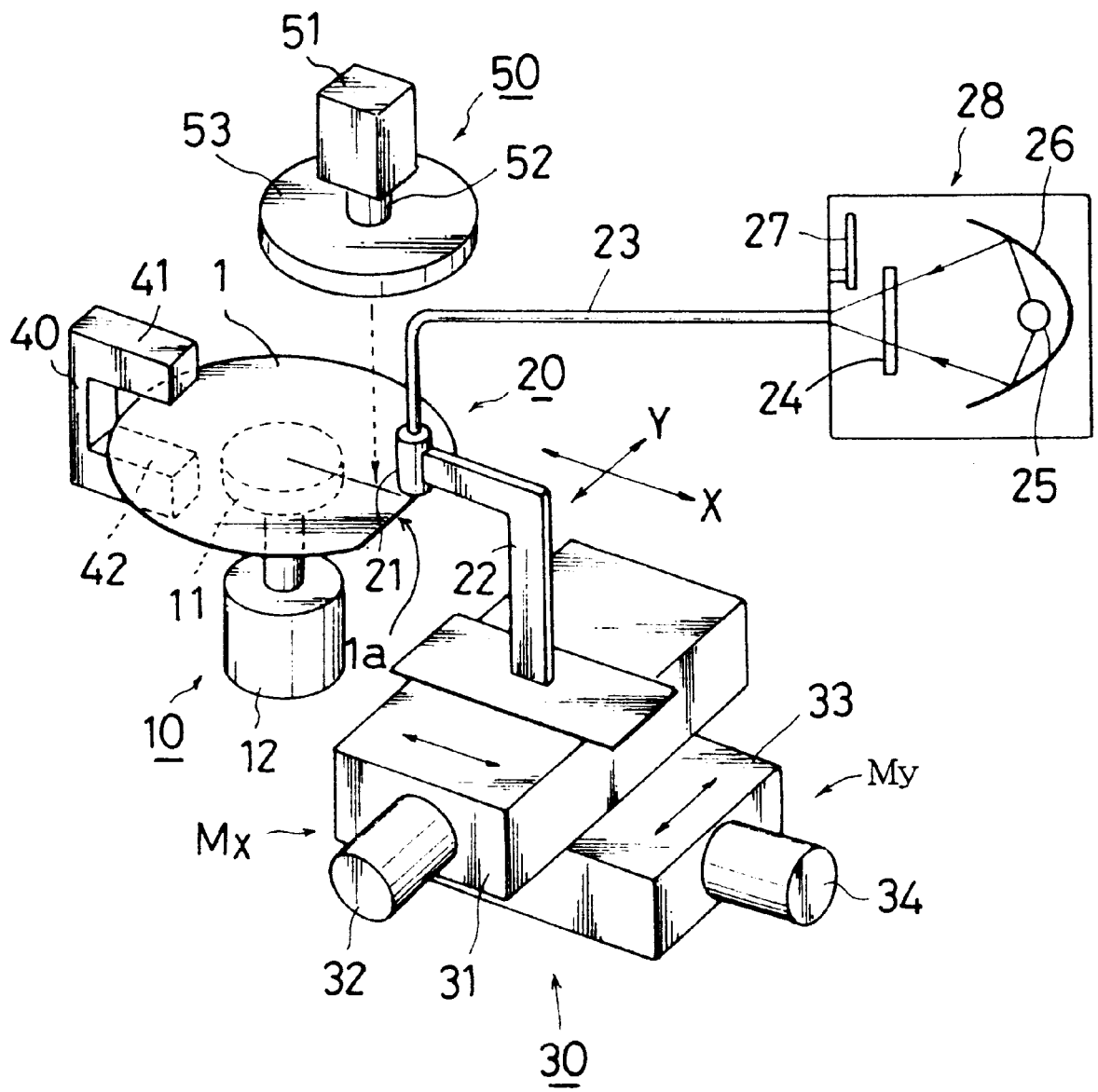
FIG. 21 is a schematic view of a periphery exposing apparatus in accordance with a second embodiment of this invention.
Figure 22:
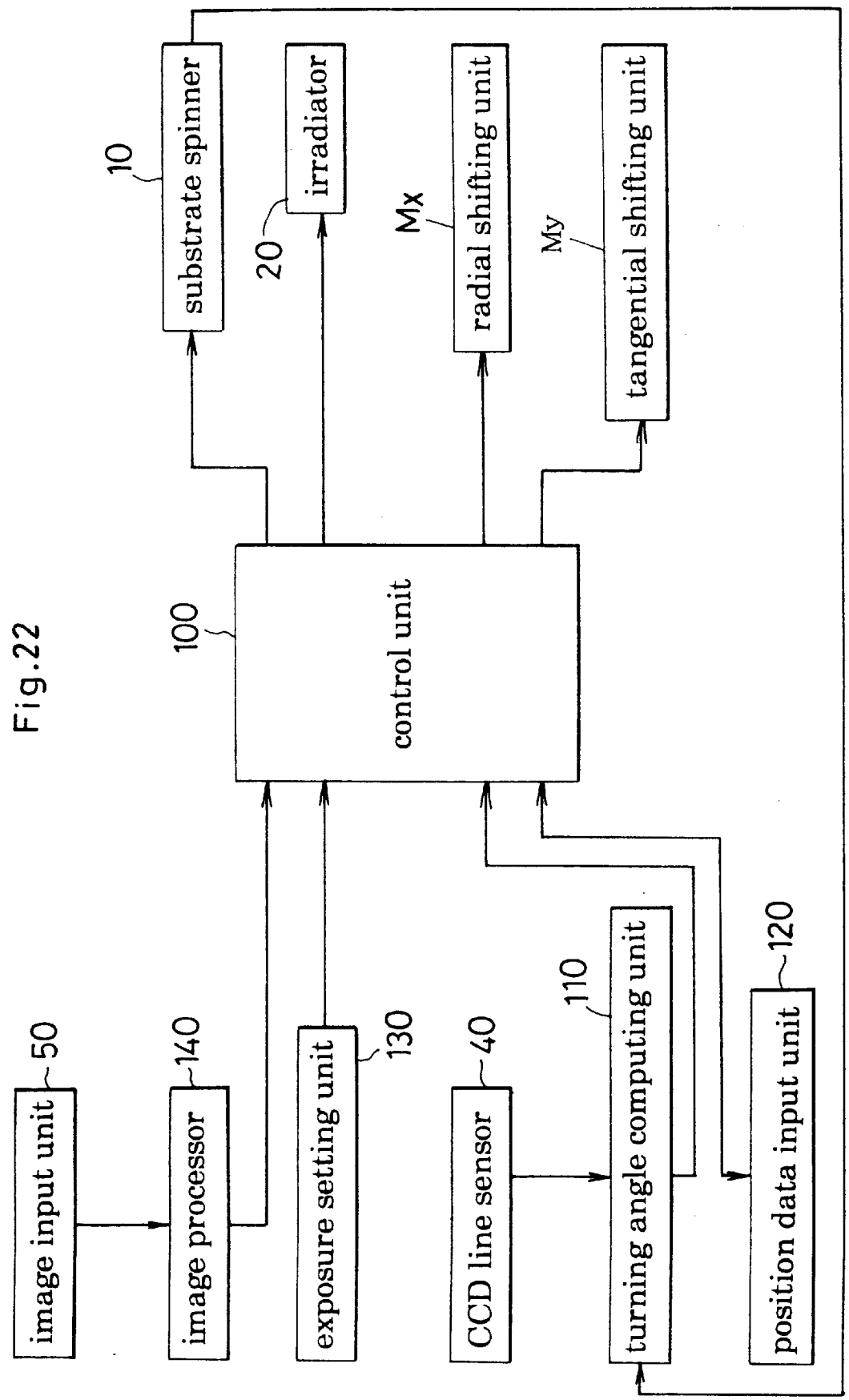
FIG. 22 is a block diagram showing a control system of the periphery exposing apparatus of FIG 21.

FIG. 21 shows a construction of a periphery exposing apparatus in accordance with a second embodiment of the invention. FIG. 22 is a block diagram showing a control system for the apparatus of FIG. 21.

The periphery exposing apparatus of the second embodiment includes an image input unit 50 and an image processor 140 in addition to the construction in the foregoing first embodiment. The control unit 100 includes a function to execute a second periphery exposing method described hereinafter, in addition to the function to execute the first periphery exposing method. The other aspects of the second embodiment are the same as in the first embodiment. Like references are used to identify like parts in FIGS. 1 and 3, which will not be described again.

The image input unit 50 is operable to input, as an image, a shape of a chip region formed on the surface of wafer 1, and includes a CCD camera 51, a camera lens 52, and an illuminator 53 for illuminating the surface of wafer 1. The camera lens 52 is attached to the CCD camera 51 and has a field angle for inputting an image for about ¼ of the circumference of wafer 1 at a time. Thus, the CCD camera 51 suitably divides the surface of wafer 1, and inputs the image of each division with rotation of wafer 1. The illuminator 53 is used when the surface of wafer 1 is insufficient illuminanced.

The image processor 140 is in the form of an image processing circuit, for example.

The apparatus in this embodiment is constructed for selectively executing two types of periphery exposing methods, i.e. the first periphery exposing method described hereinbefore, a second periphery exposing method using the image input unit 50 and image processor 140.

Figure 23:
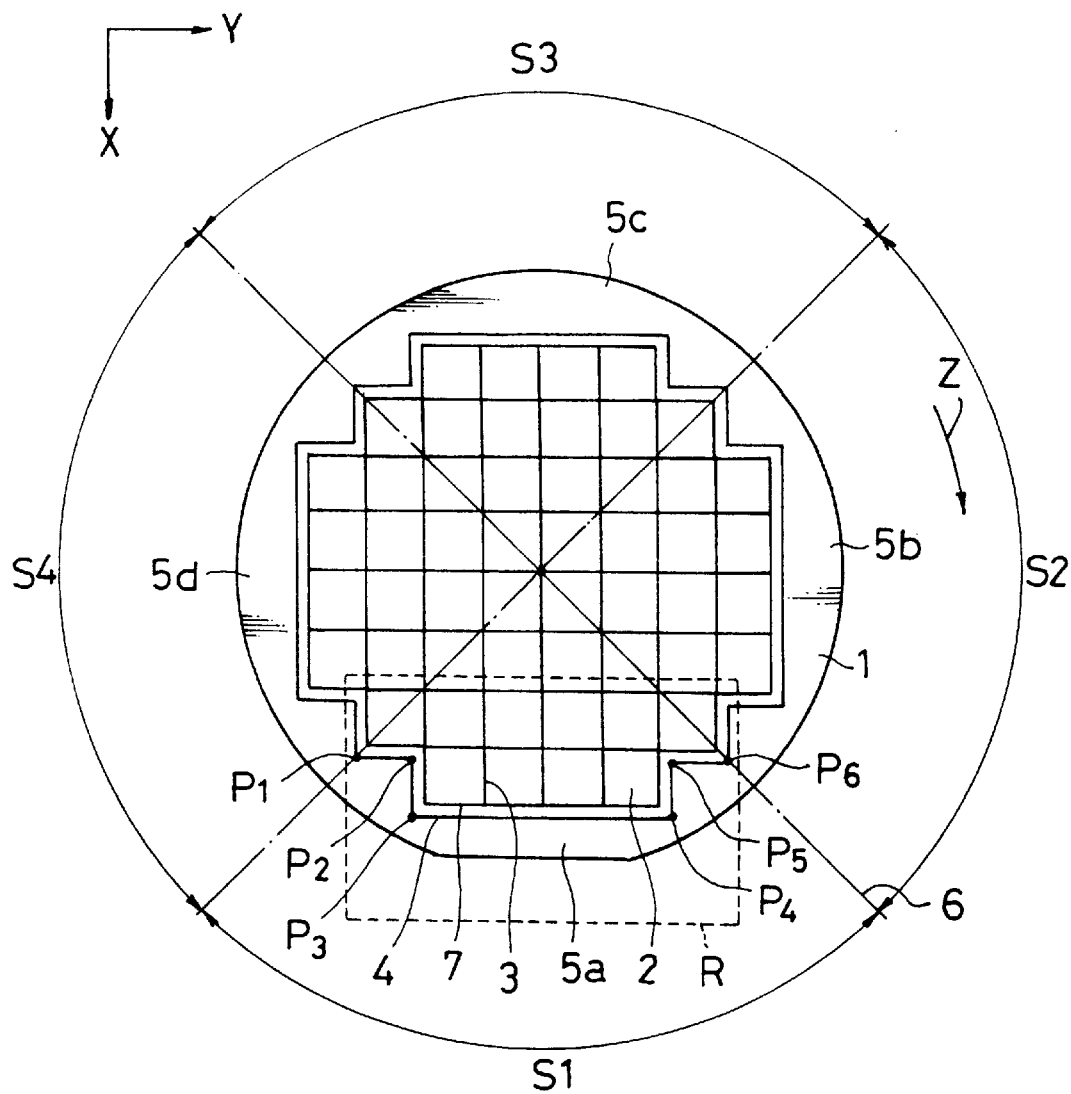
FIG. 23 is an explanatory view of a second periphery exposing method in accordance with the invention.

The second periphery exposing method will now be described. FIG. 23 is an explanatory view of an exposing operation by the second periphery exposing method. The CCD camera 51 of the image input unit 50 can input an image of a ¼ area of wafer 1 at a time. As shown in phantom lines 6 in FIG. 23, the wafer 1 is divided into four regions S1–S4. With rotation of wafer 1, the image of each division is inputted to effect periphery exposure.

As shown in FIGS. 21 and 23, the wafer 1 is first held in position to place the division S1 of wafer 1 in an imaging range of COD camera 51. A coordinate position of the imaging range of CCD camera 51 is determined in advance in relation to a reference position on XY coordinates assumed for the periphery exposing apparatus. The CCD camera 51 picks up the image of the chip region on the wafer 1 while the illuminator 53 emits illuminating light to the surface of wafer 1.

The image processor 140 recognizes cutting lines (scribe lines) 3 or alignment marks (not shown) based on image data of imaging range R inputted, and computes coordinate positions thereof. Based on the positions of scribe lines 3 or alignment marks, the image processor 140 computes coordinate positions of exposure reference points P1–P6 on a borderline 4 of a peripheral exposure region of fixed width from an outline 7 of the chip region.

After the exposure reference points P1–P6 are determined in the division SI on the wafer 1, the control unit 100 successively outputs coordinate data (position data) of exposure reference points P1–P6 to the radial shifting unit Mx and tangential shifting unit My. Based on the coordinate data, the radial shifting unit Mx and tangential shifting unit My first shift the irradiating tip 21 to the exposure reference point P1. Then, the shutter 27 of the exposing light source 28 is opened to start an exposing operation. The irradiating tip 21 shifts, under control of the radial shifting unit Mx and tangential shifting unit My, from exposure reference point PI to exposure reference point P6, successively exposing intervening areas. At this time, the shifting speed of the irradiating tip 21 is controlled based on data set through the exposure setting unit 130. This completes exposure of a peripheral exposure region Sa in the division S1.

After the periphery exposure of the division S1, the irradiating tip 21 of the irradiator 20 is retracted in the X direction away from the imaging range R of CCD camera 51. Then, the substrate spinner 10 rotates the wafer 1 by 90 degrees to move the next division S2 of wafer 1 under the CCD camera 51. A peripheral exposure region Sb is exposed in the same way as in the case of division S1 described above.

Subsequently, the divisions S3 and S4 are processed in a similar way. As a result, stepped peripheral exposure regions 5a–5d are exposed, which extend circumferentially of wafer 1.

Figure 24:
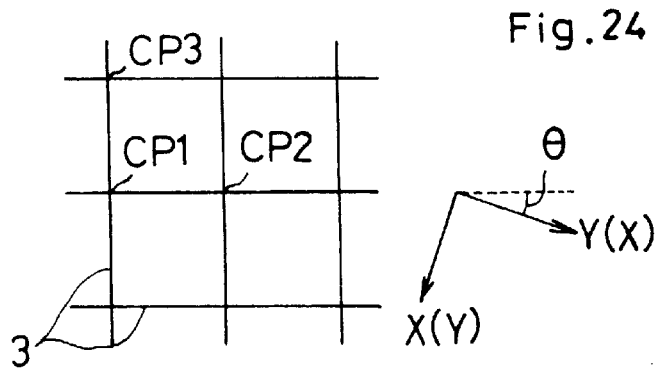
FIG. 24 is an explanatory view of an aligning step in the second periphery exposing method.

When the wafer 1 is placed on the spin chuck 11, axial directions of the outline of the chip region (axial directions of scribe lines 3) and the XY-axes may be out of alignment as shown in FIG. 24. In such a case, the image of the chip region on the wafer 1 is inputted with the first division S1 placed in the imaging range of CCD camera 51. The axial directions of the outline of the chip region in the image are computed to check if these directions are displaced from the XY-axes. In the event of a displacement therebetween, the substrate spinner 10 is rotated by an angle of displacement θ. After aligning the axial directions of the outline of the chip region on the wafer 1 to the XY-axes in this way, an exposing operation may be carried out to expose the peripheral regions 5a–5d in the respective divisions S1–S4 as described hereinbefore. Since the exposure for the divisions S1–S4 is carried out by intermittently rotating the wafer by 90° each time, the above aligning step may be taken only once in the initial stage. The axial directions of the outline of the chip region on the wafer 1 thereafter remains in alignment with the XY-axes. However, the above aligning step may be taken, as necessary, before exposing each of the peripheral regions 5a–5d in the divisions S1–S4. In computing the axial directions of the outline of the chip region (axial directions of scribe lines 3) on the wafer 1, position coordinates of three crossing points CP1, CP2 and CP3 of adjacent scribe lines 3 as in FIG. 24 may be used to determine an axial direction extending through points CP1 and CP2 and an axial direction extending through points CP1 and CP3.

Figure 25:
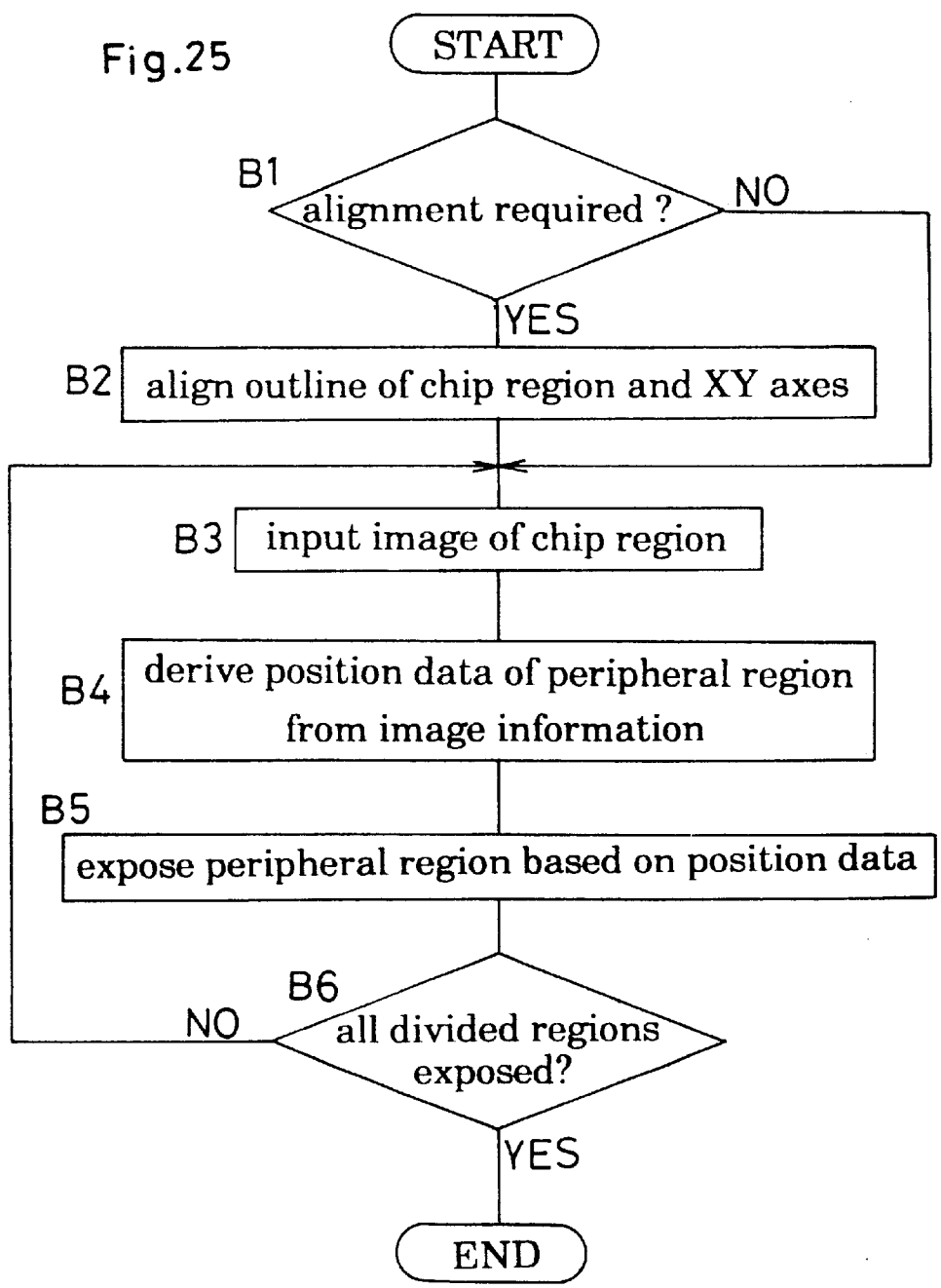
FIG. 25 is a flowchart showing a sequence of the second periphery exposing method.

FIG. 25 shows a sequence of the second periphery exposing method.

According to the second periphery exposing method, the position data of the stepped peripheral exposure region can be recognized automatically based on the image information of wafer 1. Thus, compared with the method in which the position data of the peripheral exposure region are inputted, work of the operator is simplified and processing efficiency is improved. The position data of the peripheral exposure region are derived directly from the image information of the chip region actually formed on the wafer 1. Periphery exposure is effected with high precision based on the position data of the peripheral exposure region according to the chip region actually formed on the wafer 1. This method can handle periphery exposure where a chip region is formed with reference to alignment marks, for example.

Moreover, periphery exposure is effected with high precision with the wafer 1 maintained still in a position in which the position data of the peripheral exposure region are computed.

In the second periphery exposing method, exposure is carried out by using CCD camera 51 and computing the position data of peripheral exposure regions 5a–5d from the image information of the chip region on the wafer 1. However, in an initial manufacturing stage in which a chip pattern is not formed on the wafer 1 yet, it is difficult to input the shape of the chip region as image information through CCD camera 51. Further, the image inputted can be indistinct so that the position data of the peripheral exposure region cannot be obtained from the image information.

To cope with such cases, the second embodiment allows the first periphery exposing method to be selected as a compensatory measure to effect periphery exposure. Where this measure is not required, the construction relating to the first periphery exposing method may be omitted to enable only the second periphery exposing method.

Figure 26:
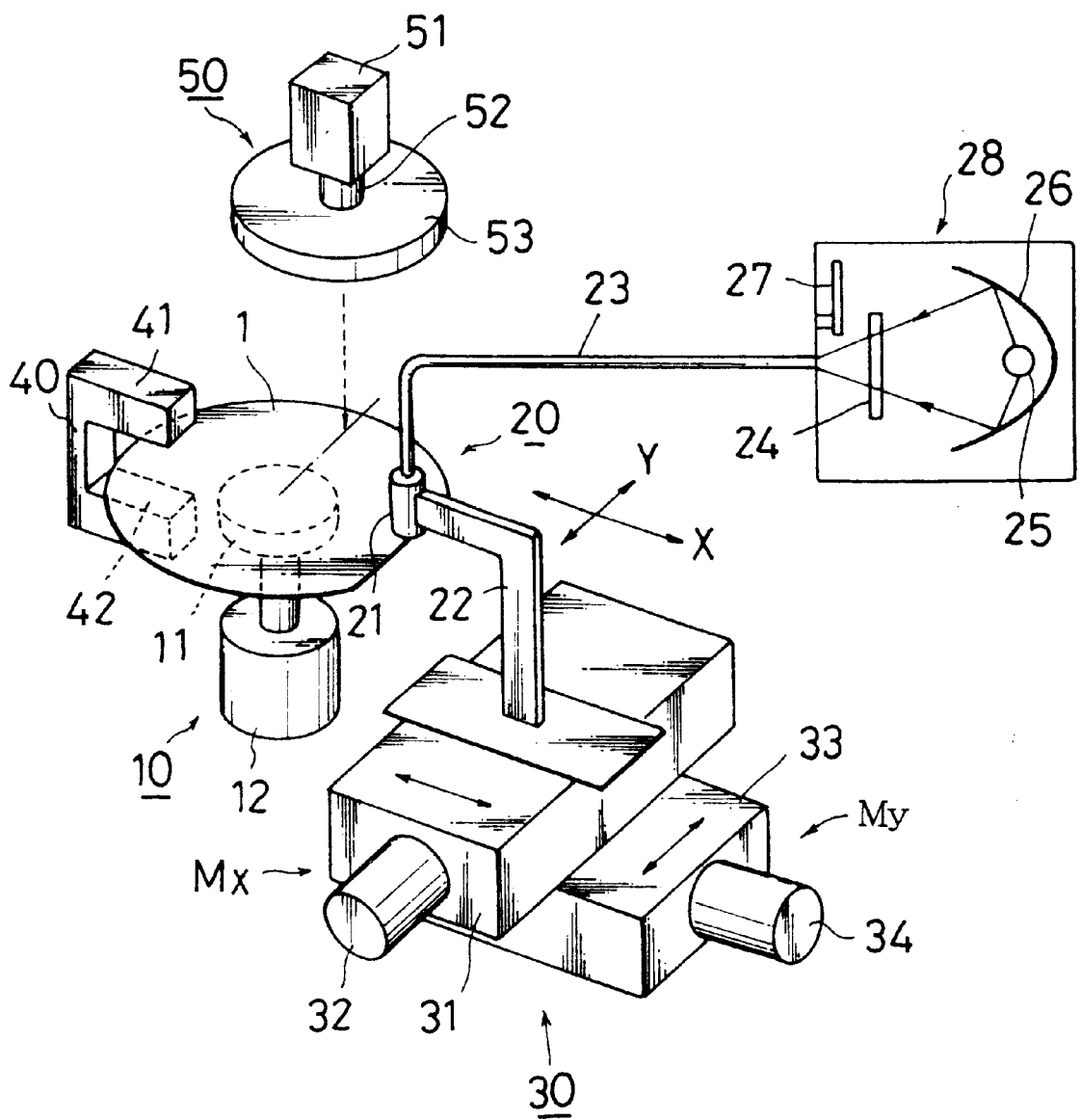
FIG. 26 is a schematic view of a modification of the apparatus in of FIG. 21.
Figure 27:
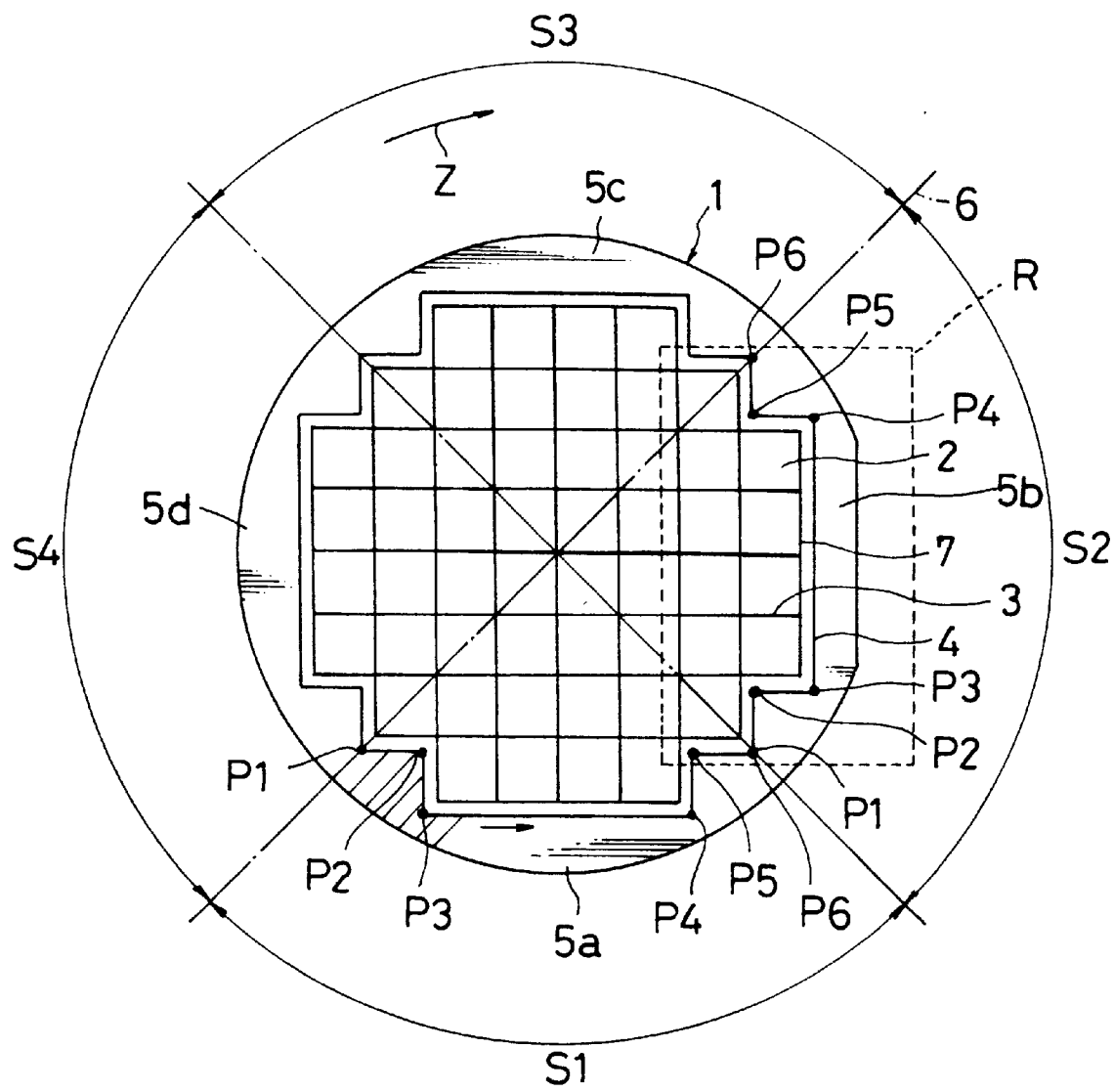
FIG. 27 is an explanatory view showing an exposing operation in accordance with the modification shown in FIG. 26.

FIG. 26 shows a modification of the apparatus in the second embodiment. FIG. 27 is an explanatory view of a periphery exposing operation of this modification. This modification is different from the apparatus in the second embodiment in that the image input unit 50 and irradiator 20, particularly irradiating tip 21, above the wafer 1 are arranged in positions spaced apart by 90 degrees in the rotating direction of wafer 1. Thus, the irradiating tip 21 of irradiator 20 do not enter the imaging range of CCD camera 51 of image input unit 50.

Where the surface of wafer 1 is divided into four regions S1–S4 as shown in FIG. 27, the modified construction is capable of detecting positions in the peripheral region in one division and exposing the peripheral region in another division at the same time. For example, the image input unit 50 may be operated to detect position coordinates of exposure reference points P1–P6 in the peripheral region 5b in the division S2. At the same time, the irradiator 20 may be operated to effect periphery exposure for the division S1 based on the position information of exposure reference points P1–P6 already obtained through the image input unit 50.

After the two processes are completed, the substrate spinner 10 rotates the wafer 1 by 90 degrees. Then, the irradiator 20 is operated to effect periphery exposure for the division S2 where the peripheral region has been detected. For the division S3 not processed yet, positions in the peripheral exposure region are detected through the image input unit 50.

Similar processes are carried out to complete periphery exposure for all divisions S1–S4.

This modification provides improved processing efficiency by detecting positions in a peripheral region and exposing a different peripheral region at the same time.

Figure 28:
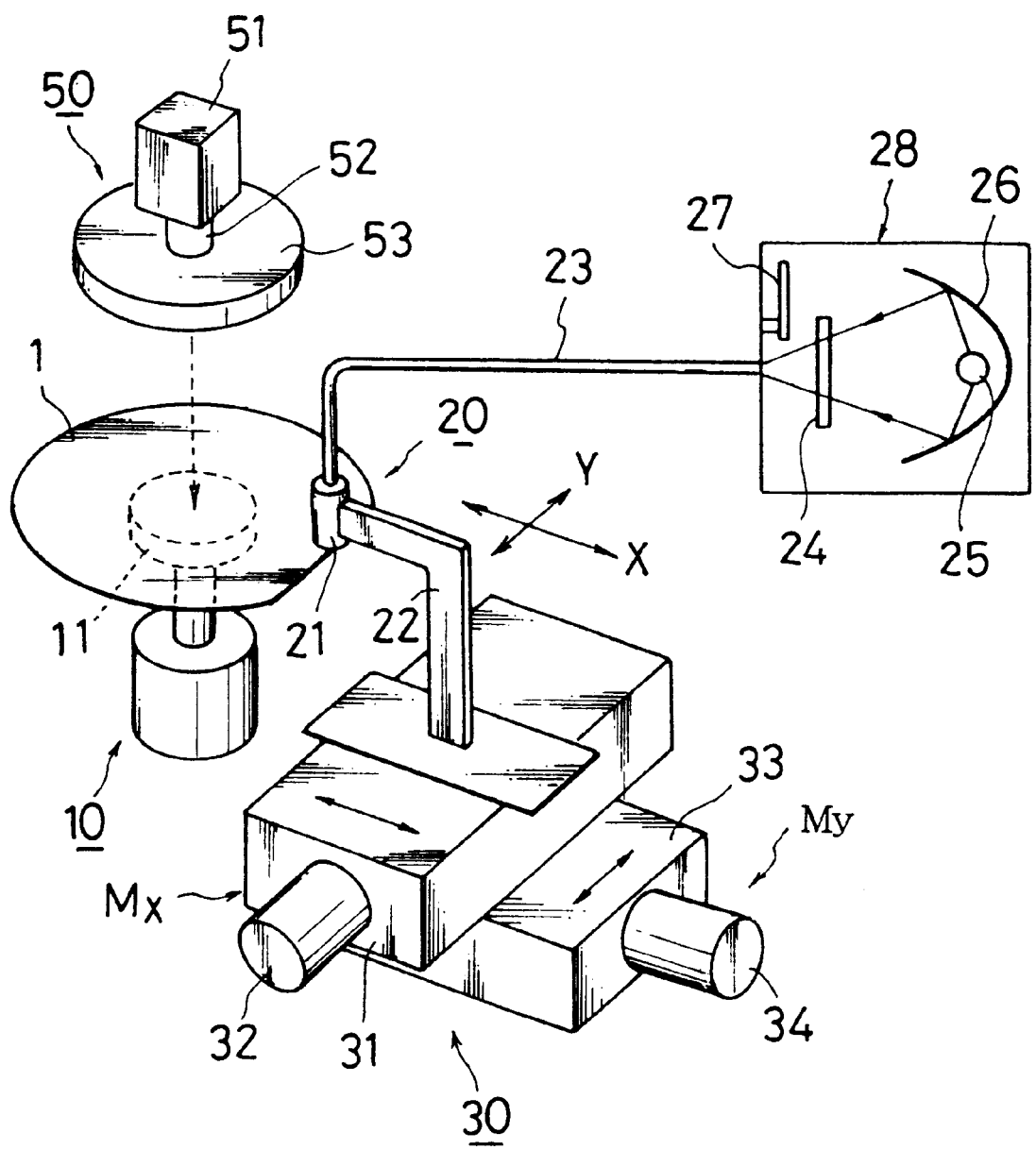
FIG. 28 is a schematic view of another modification of the apparatus of FIG. 21.

FIG. 28 shows another modification of the second embodiment. In this modification, the CCD camera 51 of image input unit 50 has an imaging range for covering the entire wafer 1. Each of the radial shifting unit Mx and tangential shifting unit My has a shifting range for covering the entire wafer 1. Thus, this modification is capable of detecting positions in the peripheral exposure region and effecting stepped periphery exposure without rotating the wafer 1.

Third Embodiment

Figure 29:
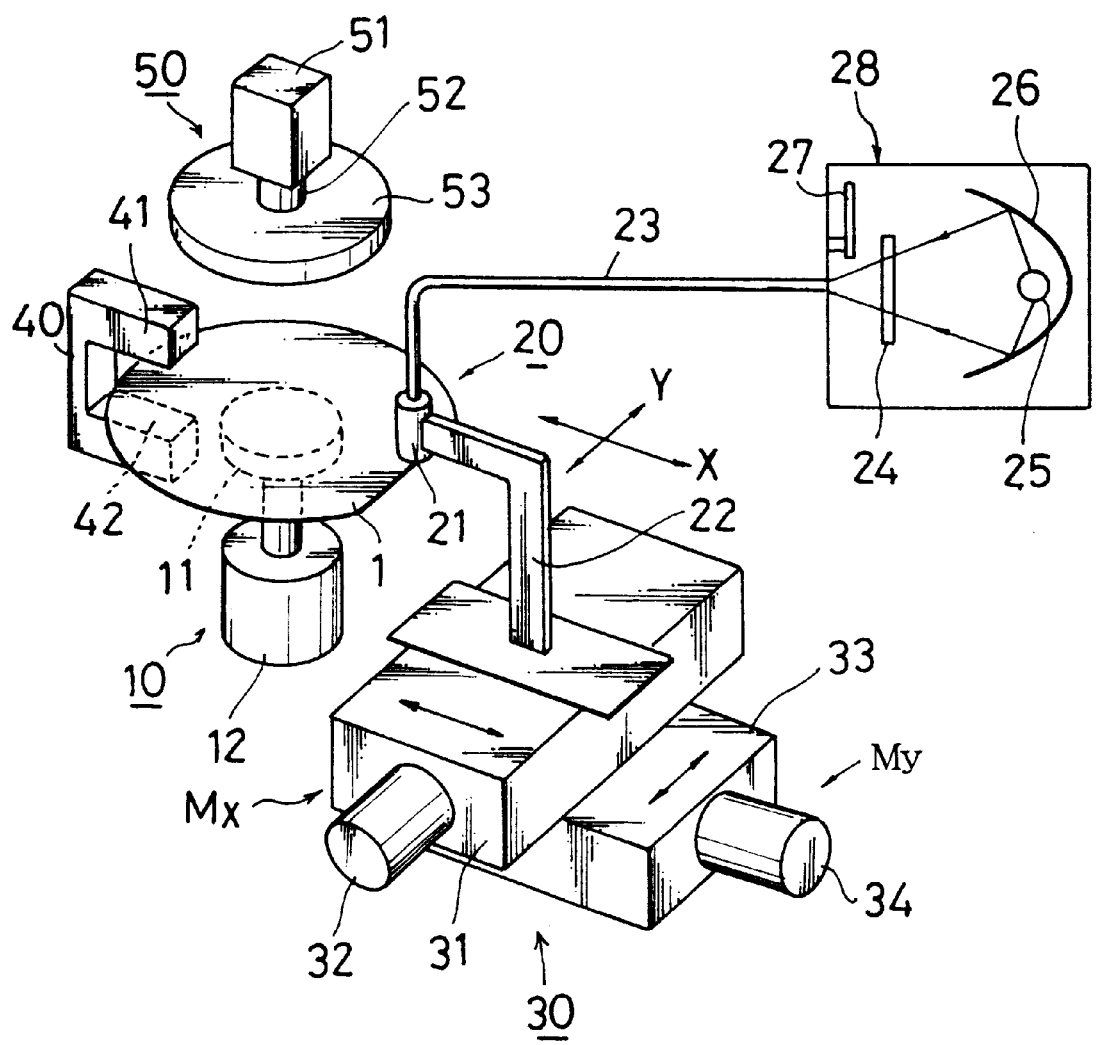
FIG. 29 is a schematic view of a periphery exposing apparatus in accordance with a third embodiment of this invention.
Figure 30:
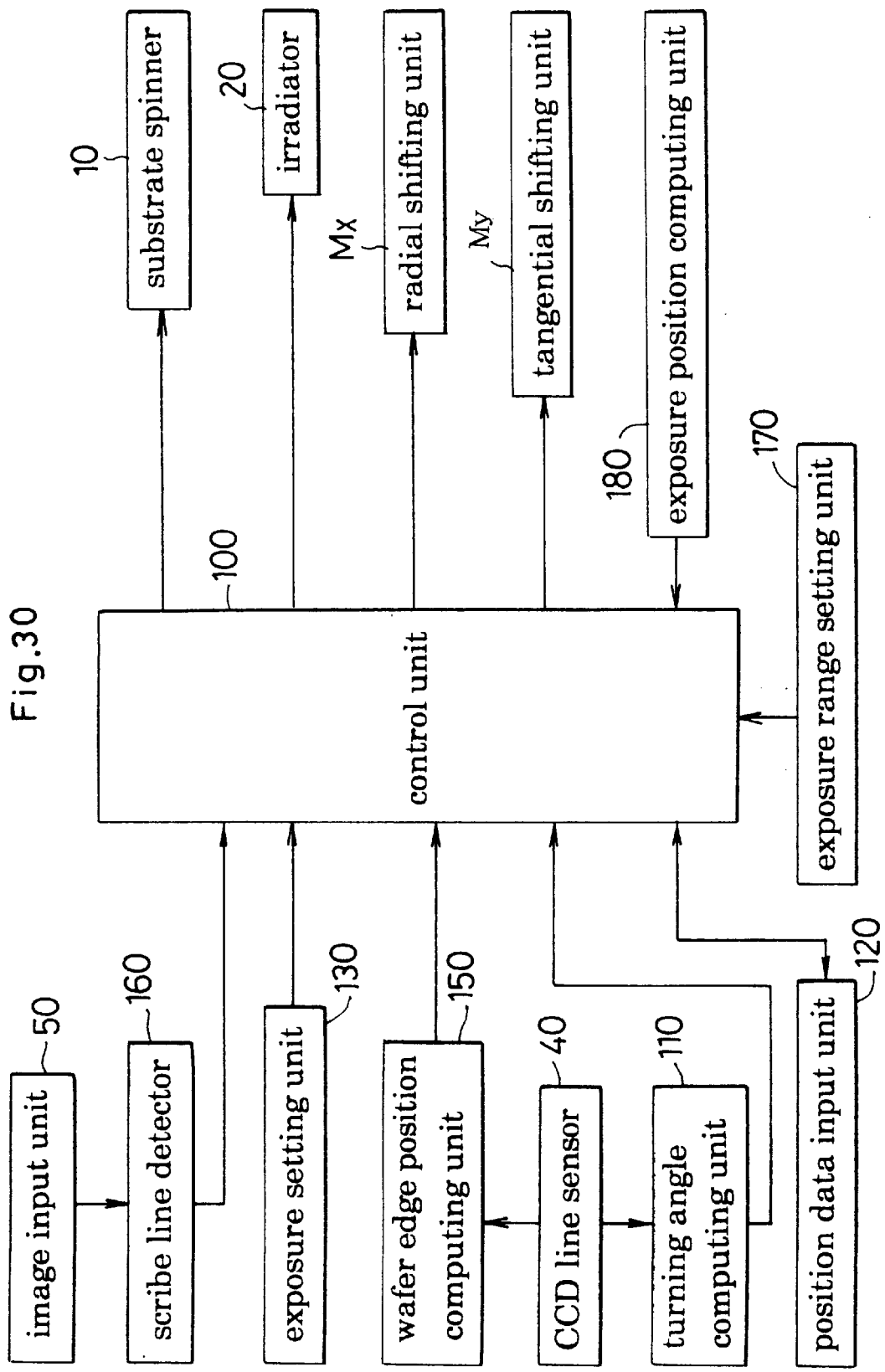
FIG. 30 is a block diagram showing a control system of the periphery exposing apparatus of FIG. 29.

FIG. 29 shows a construction of a periphery exposing apparatus in accordance with a third embodiment of the invention. FIG. 30 is a block diagram showing a control system thereof.

With reference to FIG. 30, the periphery exposing apparatus in accordance with the third embodiment includes an image input unit 50, a scribe line detector 160, a wafer edge position computing unit 150, an exposure range setting unit 170 and an exposure position computing unit 180 in addition to the construction of the foregoing first embodiment. The control unit 100 includes a function to execute a third periphery exposing method described hereinafter, in addition to the function to execute the first periphery exposing method. The other aspects of the third embodiment are the same as in the first embodiment. Like references are used to identify like parts in FIGS. 1 and 3, which will not be described again.

The image input unit 50 is constructed as in the second embodiment (see FIG. 21). The image input unit 50 in the third embodiment has an imaging range for inputting at least one crossing point where two chip-separating scribe lines on the wafer 1 intersect each other at right angles, and scribe line segments adjacent the crossing point. The CCD camera 51 is disposed above the wafer 1. Preferably, the CCD camera 51 is disposed over the center of wafer 1, which is effective for avoiding an interference with the irradiating tip 21 of irradiator 20.

The wafer edge position computing unit 150 and exposure position computing unit 180 may be in the form of a personal computer, for example. The exposure range setting unit 170 may be in the form of a display and a keyboard. The scribe line detector 160 is in the form of an image processing circuit, for example.

The apparatus in this embodiment is constructed for selectively executing two types of periphery exposing methods, i.e. the first periphery exposing method described hereinbefore, and the third periphery exposing method described hereinafter.

The third periphery exposing method will be described with reference to the flowchart shown in FIG. 31.

Figure 32:
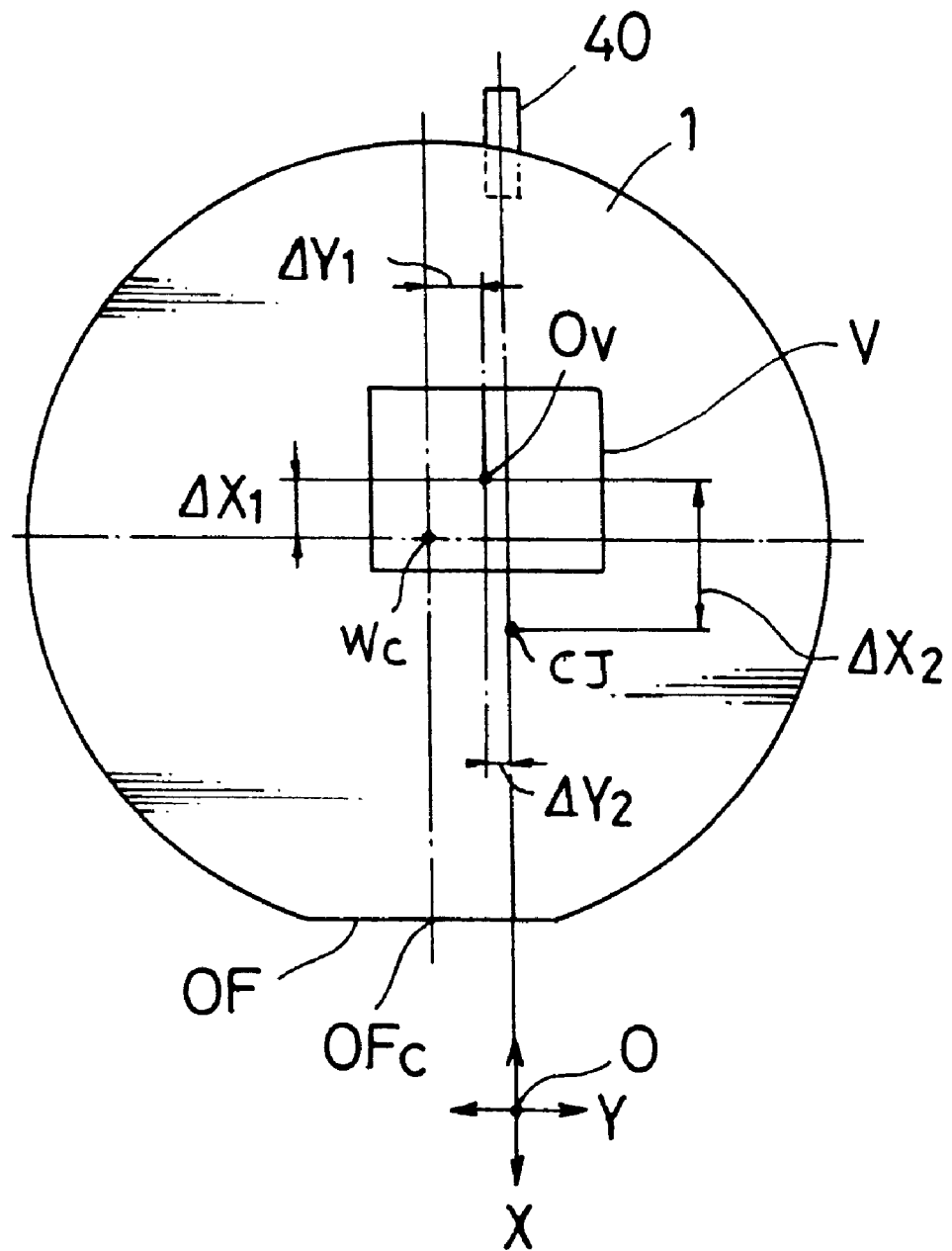
FIG. 32 is an explanatory view showing an offset relationship among the wafer in accordance with the invention center spin center and view center in the periphery exposing apparatus.

Before describing a periphery exposing operation, a positional relationship among the center Wc of wafer 1, the spin center CJ of spin chuck 11 the view center Ov of imaging region V of CCD camera 51, and a coordinate system of the periphery exposing apparatus, will be described with reference to FIG. 32.

The spin center CJ of spin chuck 11 is located on the X-axis. The CCD line sensor 40 has a detecting position also on the X-axis. The sbifter 30 has an origin of shifting set to point O in FIG. 32.

As noted hereinbefore, it is preferable that the wafer 1 is placed on the spin chuck 11, with the center Wc thereof in register with the spin center CJ of spin chuck 11. In practice, however, the center Wc of wafer 1 could be displaced from the spin center CJ. Further, it is difficult to position the CCD camera 51 to have the view center Ov in register with the spin center CJ of spin chuck 11. The view center Ov could also be displaced from the spin center CJ. In such a case, the center Wc of wafer 1, view center Ov and spin center CJ may be displaced from one another as shown in FIG. 32 Thus, the third periphery exposing method includes steps which take these displacements into account as described hereinafter.

First, when assembling the CCD camera 51 to the periphery exposing apparatus, an amount of offset between the view center Ov of CCD camera 51 and the spin center CJ of spin chuck 11 is detected. For example, a dummy wafer having a "+" mark in a central portion thereof is placed on the spin chuck 11. The wafer 1 is rotated intermittently by 1/n rotation (n being an integer 2 or more). After each 1/n rotation, an image including the "+" mark is picked up through the CCD camera 51. Then, the scribe line detector 160 is operated to compute positions of the "+" mark in the n images. An average of these positions is regarded as the spin center CJ. Then, a displacement ($\Delta X2$, $\Delta Y2$) between the spin center CJ determined as above and the view center Ov of CCD camera 51 is detected and stored in memory.

Figure 31:
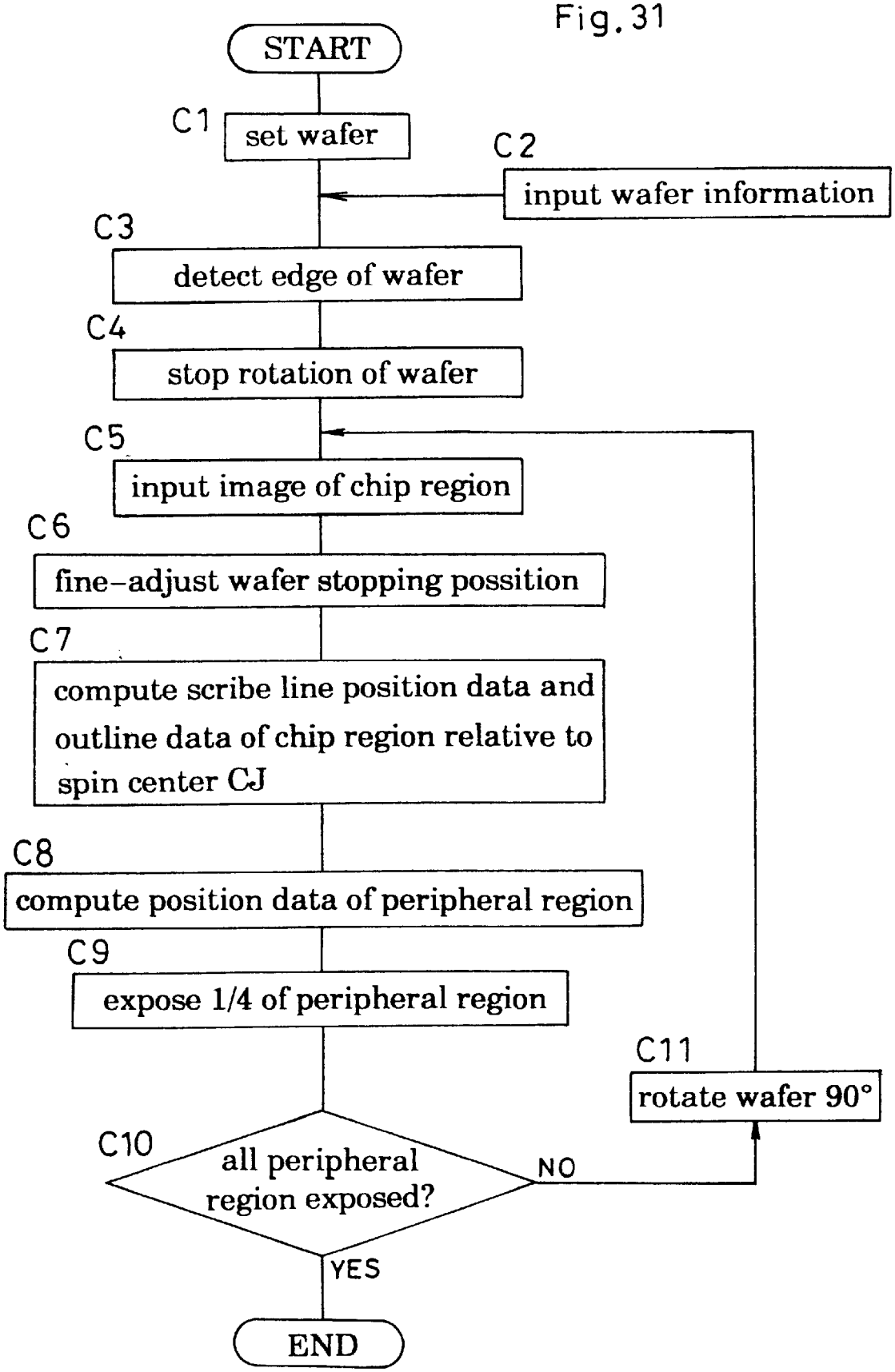
FIG. 31 is a flowchart showing a sequence of a third periphery exposing method in accordance with the invention.

Referring to FIG. 31, when periphery exposure by the third periphery exposing method is started, a wafer 1 to undergo the periphery exposure is and placed on the spin chuck 11 by the transport mechanism (not shown) (step C1).

Figure 33:
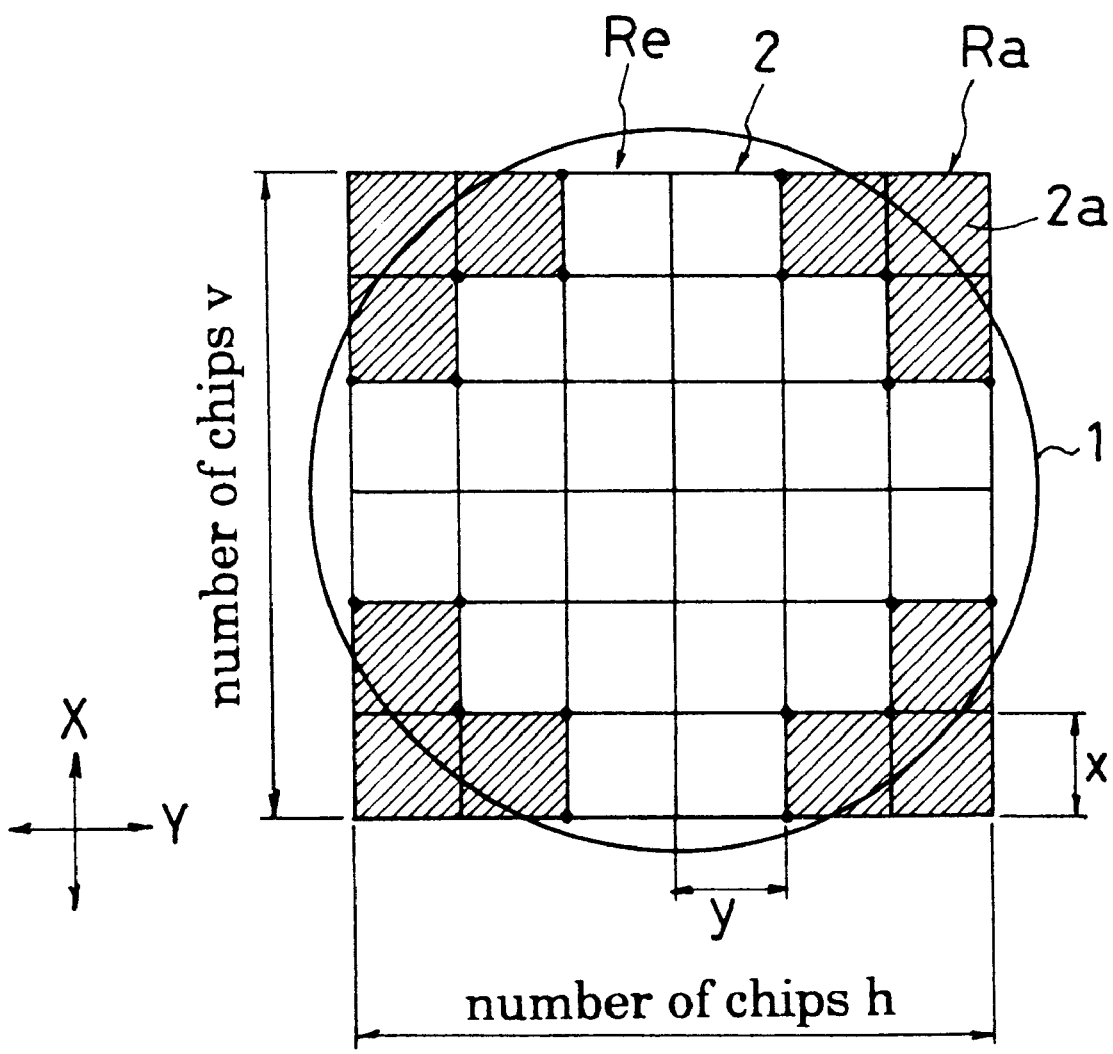
FIG. 33 is an explanatory view of an operation to determine an effective chip region on a wafer.

Next, the operator inputs the size (configuration) of wafer 1, chip sizes (size x in X-direction and size y in Y-direction) and the number of chips arranged (the number of chips y in Y-direction and the number of chips v in X-direction) through the exposure range setting unit 170 having a keyboard, a control panel and so on. Alternatively, this information may be inputted from a stepper or other device. The wafer information inputted is shown on a display screen. FIG. 33 is a schematic view of the wafer information shown on the screen. Based on the wafer information, a rectangular chip region Ra is specified with v chips 2 arranged along X-axis and h chips 2 along Y-axis. The chip region Ra displayed includes inappropriate chips 2a (shown in hatching) partly protruding from the wafer 1. Such inappropriate chips 2a are displayed in inversion on the screen, and are excluded from an effective chip region Re.

Further, the operator designates chips 2 not to be exposed in the effective chip region Re displayed, to determine a chip region Re to be exposed. A range of effective chip region Re is thereby established and this information is stored in memory (step C2).

Next, the motor 12 is started, and the CCD line sensor 40 is operated to detect the outer edge of wafer 1 in rotation. The photodiode of CCD line sensor 40 outputs OFF signals from elements thereof under the wafer 1, and ON signals from elements lying outwardly of wafer 1. Based on positions of the CCD elements outputting ON signals, radii from the spin center CJ of spin chuck 11 to the outer edge of wafer 1 are obtained in a plurality of locations at intervals of several degrees along the outer edge. At the same time, the CCD line sensor 40 also detects angles of rotation of the edge locations at which the radii are obtained.

If the center Wc of wafer 1 is in register with the spin center CJ of spin chuck 11, the number of elements outputting ON signals is invariable. Otherwise, the number of elements outputting ON signals varies. As described in relation to FIGS. 13A and 13B, for example, the center Wc of wafer 1 is derived from the variations in the number of elements, to determine an amount of its offset from the spin center CJ of spin chuck 11. In the example shown in FIG. 32, the amount of offset is ($\Delta x1$, $\Delta Y1$) (step C3).

As described in the first embodiment, the middle OFc of orientation flat OF is detected. The wafer 1 is stopped at a position where the middle Ofc of orientation flat OF concurs with the detecting position of CCD line sensor 40, or at a position rotated 90 degrees, 180 degrees or 270 degrees therefrom. As shown in FIG. 32, the CCD line sensor 40 has the detecting position set on the X-axis extending through the spin center CJ of spin chuck 11. When the wafer 1 is stopped at the above-mentioned position, the linear portion of orientation flat OF of wafer 1 extends substantially parallel to the X-axis or the Y-axis. The following description will be made on the assumption that the wafer 1 is stopped where, as shown in FIG. 32, the orientation flat OF extends parallel to the Y-axis in a position remote from the CCD line sensor 40 (step C4).

Figure 34:
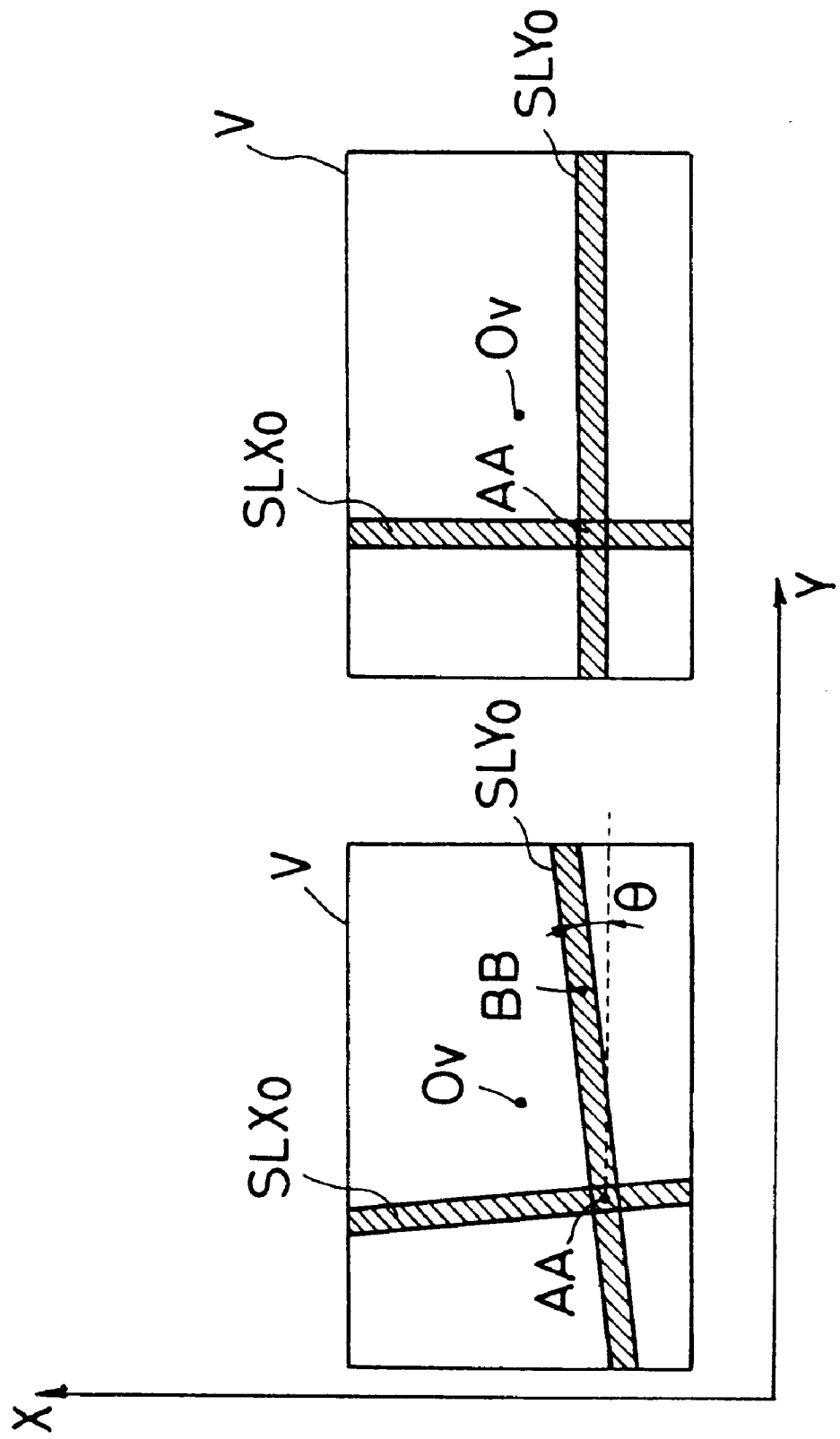
FIGS. 34A and 34B are schematic views of images inputted through a CCD camera in accordance witht he invention.

Next, an image of the chip region on the wafer 1 is inputted through the image input unit 50 (step C5). FIGS. 34A and 34B are schematic views of images of the chip region inputted. In FIG. 34A, the imaging range of CCD camera 51 has a size including a corner (crossing point of scribe lines) of at least one chip 2.

The scribe line detector 160 identifies scribe lines SLXO and SLYO in the image information inputted, and determines position coordinates of crossing point AA of the scribe lines and position coordinates of a given point BB on the scribe line SLYO. Then, it is determined from the coordinates of two points AA and BB whether the scribe line SLY0 is parallel to Y-axis or not. The wafer 1 is rotated if the scribe line SLYO is inclined by angle θ as in FIG. 34A. In this way, a fine adjustment is made to the stopping position of wafer 1 whereby, as shown in FIG. 34B, the scribe line SLY0 extends parallel to Y-axis (to align axial directions of the scribe lines to the XY-axes) (step C6).

Figure 35:
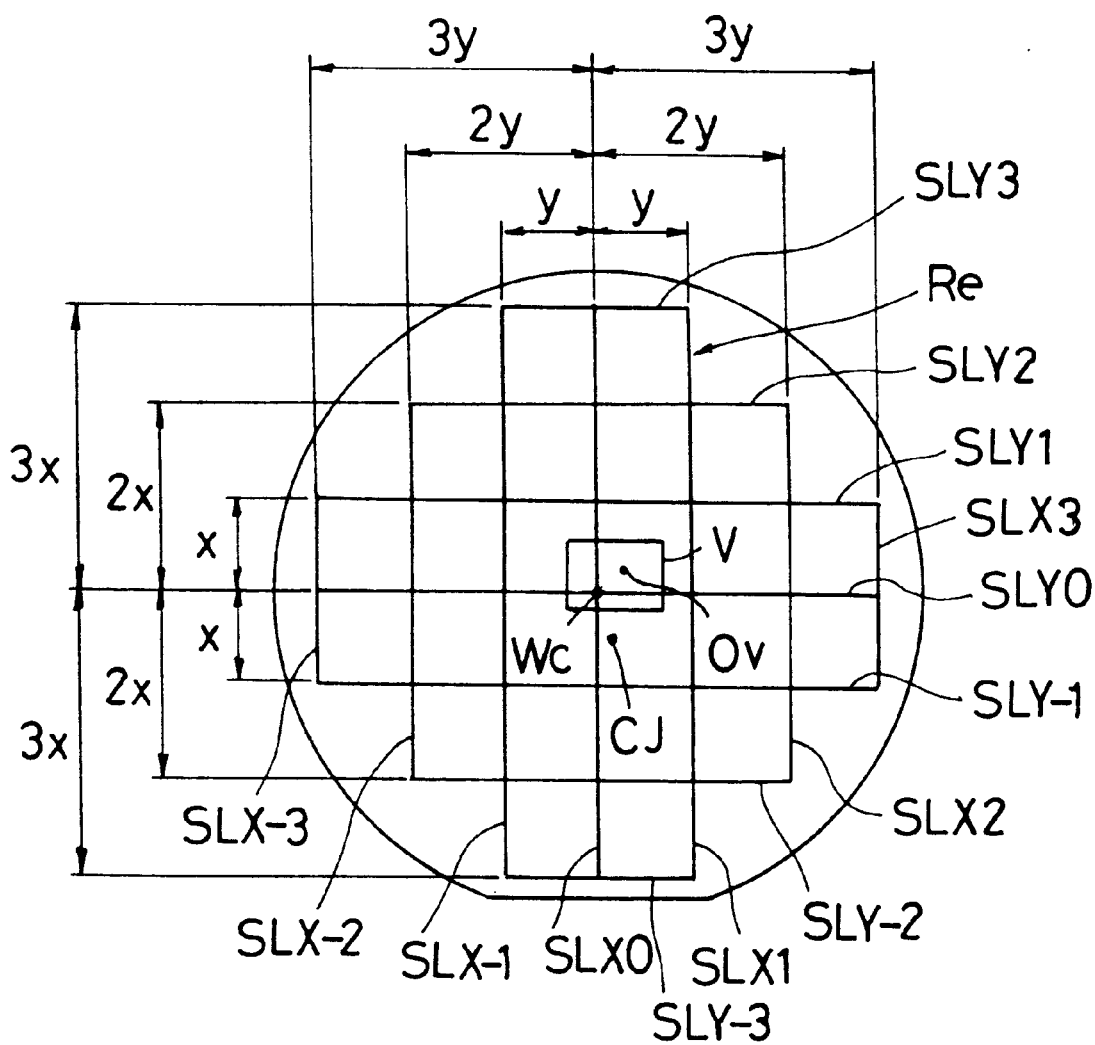
FIG. 35 is an explanatory view of an operation of a scribe line position computing unit in accordance with the invention.

FIG. 35 is an explanatory view of a scribe line position computing operation. The scribe line detector 160 also computes coordinates of each of scribe lines SLX-0 through SLX-0 and SLY-3 through SLY3 with reference to the view center Ov and based on the chip size (x, y) inputted in advance through the exposure range setting unit 170. This operation provides coordinates of each reference point arranged peripherally of the chip region Re. The amount of offset between the view center Ov and the spin center CJ of spin chuck 11 already determined is added to the respective coordinates, to determine coordinates of the reference points on the outline of the chip region Re relative to the spin center CJ of spin chuck 11 (step C7).

Figure 36:
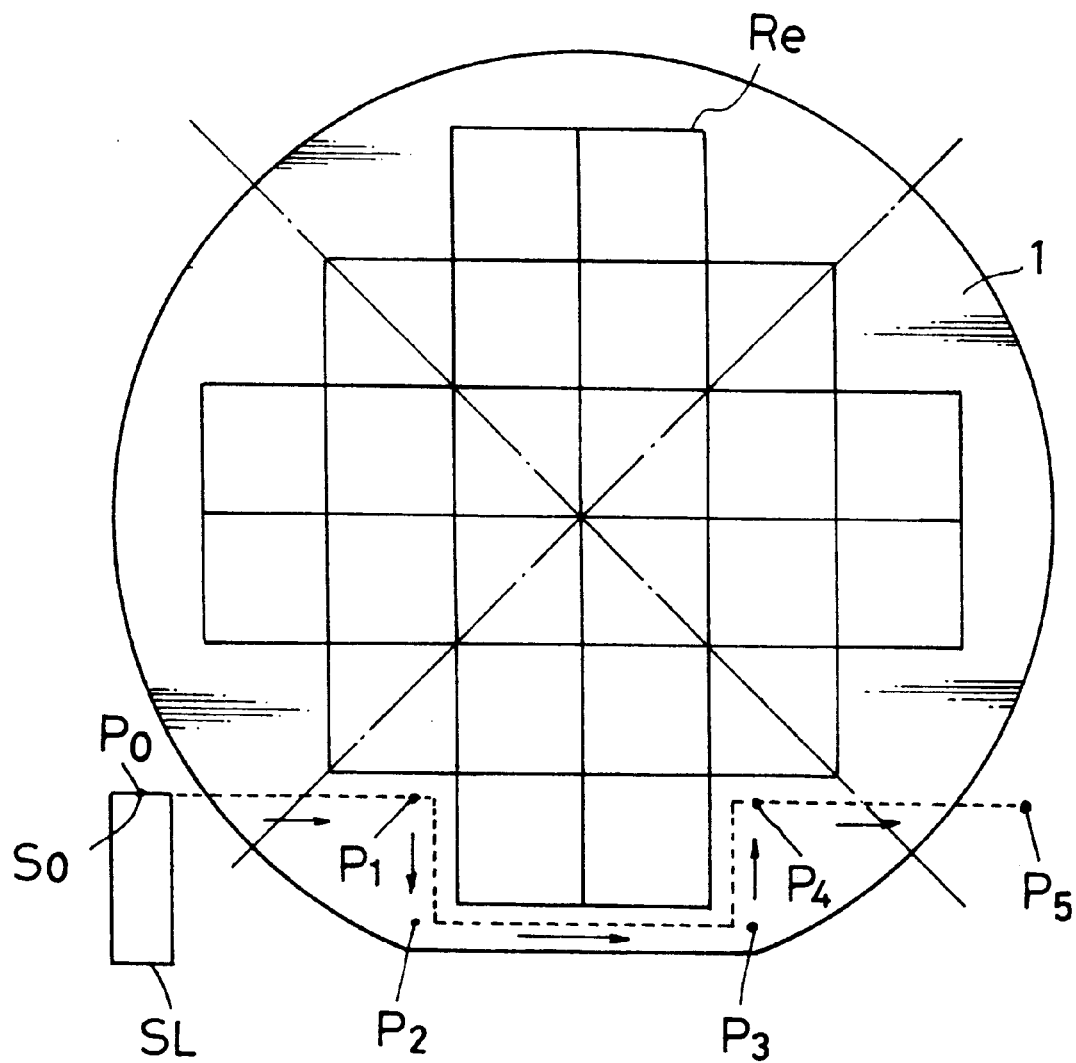
FIG. 36 is an explanatory view of an exposing operation by a third periphery exposing method in accordance with the invention.

FIG. 36 is an explanatory view of an operation by the third periphery exposing method. After the coordinates of the reference points describing the outline of chip region Re are determined, the exposure position computing unit 180 computes position data of exposure reference points P0–P5 as shown in FIG. 36, by adding to the above coordinates an offset width for exposing a region of fixed width from the outline of chip region Re. The offset width of the peripheral exposure region with respect to the outline of chip region Re is set to 200 $\mu$m or less, for example (step C8).

As shown in FIG. 36, periphery exposure is effected for each quarter division of the wafer 1. The spotlight SL emitted from the irradiating tip 21 of irradiator 20 is preferably restricted to a rectangular shape. The shifter 30 first shifts the irradiating tip 21 to a position where a reference point SO of spotlight SL concurs with the exposure reference point P0, and then starts emission of spotlight SL. The irradiating tip 21 is shifted successively from reference point P0 to reference point P5 as indicated by arrows in FIG. 36, to expose approximately a quarter of the peripheral region of wafer 1 (step C9). At this step C9, if the center Wc of wafer 1 is displaced from the spin center CJ, the shifts of spotlight SL are adjusted by adding or subtracting the amount of offset between the center Wc of wafer 1 and the spin center CJ determined at step C3 above, to/from the position data of respective exposure reference points P0–P5.

Subsequently, it is checked whether all peripheral regions of wafer 1 have been exposed or not (step C10). If the periphery exposure is not completed, the wafer 1 is rotated 90 degrees (step C11) and steps C5 through C9 are repeated.

When all peripheral regions have been exposed, the periphery exposure is terminated. As a result, a peripheral region exposed in a staggered way is formed along the outline of chip region Re.

As described above, the periphery exposing apparatus in this embodiment has the CCD line sensor 40 for detecting outer edge positions of the wafer, and the CCD camera 51 for inputting a shape of one corner of a chip on the wafer 1 as image information. Outer dimensions of chip region Re are computed by detecting a crossing point of one scribe line. Based on these dimensions, coordinates of a peripheral exposure region are computed to carry out periphery exposure. It is therefore unnecessary to input precise position data of the peripheral exposure region. These features provide the periphery exposing apparatus and method with excellent operability and high processing efficiency.

When images of the surface of wafer 1 cannot be obtained or the images are indistinct in an initial wafer processing stage, the first periphery exposing method is selected for carrying out periphery exposure. However, the construction relating to the first periphery exposing method may be omitted from the third embodiment, to enable only the third periphery exposing method.

In the above construction, the CCD camera 51 is disposed for picking up an image of an area including a crossing point of scribe lines in a center portion of wafer 1. However, the CCD camera 51 may be disposed for picking up an image of any crossing point of scribe lines within the chip region Re, without limiting the area to the center portion. In this case, the position of a crossing point of scribe lines may be computed from an amount of offset between the spin center CJ of spin chuck 11 and the view center Ov of CCD camera 51.

In the above construction, outer edge positions of wafer 1 are detected by using the CCD line sensor 40. However, outer edge positions of wafer 1 may be detected by other means.

In the above construction, periphery exposure is effected for each quarter region of wafer 1. Where the shifter 30 has a large shifting range in XY-directions so that the irradiating tip 21 is shiftable over the entire surface of wafer 1, peripheral exposure may be effected without rotating the wafer 1. In this case, the exposure position computing unit 180 is adapted to compute all exposure reference points in the entire periphery exposure region of wafer 1 at the same time.

The present invention may be embodied in other specific forms without departing from the spirit or essential attributes thereof and, accordingly, reference should be made to the appended claims, rather than to the foregoing specification, as indicating the scope of the invention.

What is claimed is:

1. An apparatus for exposing a peripheral region around a chip region of a photosensitive layer applied to a substrate along an outline of the chip region, comprising:

a substrate support for supporting said substrate;

a detector for detecting a reference position at an outer edge of said substrate;

a light source for irradiating said photosensitive layer on said substrate with light;

orthogonal shifting means for shifting the light of said light source in two orthogonal directions relative to said photosensitive layer;

position data input means for inputting position data of said peripheral region along said outline of said chip region;

aligning means for aligning axial directions of said position data and said orthogonal shifting means based on detection results provided by said detecting means; and a controller for controlling said orthogonal shifting means to shift the light of said light source along said peripheral region based on said position data and exposing said peripheral region along said outline of said chip region.

2. The apparatus as defined in claim 1, wherein said peripheral region is divided into a plurality of regions, said peripheral region being exposed one division after another.

3. The apparatus as defined in claim 1, further comprising a rotating means for rotating the light of said light source relative to said photosensitive layer on said substrate and along an arcuate edge of said substrate, said controller controlling said rotating element to shift the light of said light source along said arcuate edge of said substrate before or after exposure along said peripheral region of said photosensitive layer.

4. An apparatus for exposing a peripheral region around a chip region of a photosensitive layer applied to a substrate along an outline of the chip region, comprising:

a substrate support for supporting said substrate;

image input means for inputting as image information, a shape of said chip region on said substrate;

an image processor for deriving position data of said peripheral region on said outline of said chip region from said image information;

an irradiating light source for irradiating said photosensitive layer on said substrate with light;

shifting means for shifting the light of said light source relative to said photosensitive layer; and a controller for controlling said shifting means such that the light of said light source shifts based on said position data and exposes said peripheral region.

5. The apparatus as defined in claim 4, wherein said shifting means includes an orthogonal shifting means for shifting the light of said light source in two orthogonal directions relative to said photosensitive layer, said apparatus further comprising an aligning means for deriving axial directions of said outline of said chip region on said substrate from said image information and align said axial directions with said orthogonal shifting means.

6. The apparatus as defined in claim 4, wherein said image input means has an imaging range smaller than said chip region, said apparatus further comprising a rotating means for rotating said substrate stepwise by a predetermined degree according to said imaging range.

7. The apparatus as defined in claim 6, wherein said light source and said image input means are arranged such that an exposure range of said light source and said imaging range of said image input means overlap one another.

8. The apparatus as defined in claim 6, wherein said light source and said image input means are arranged such that an exposure range of said light source and said imaging range of said image input means do not overlap.

9. The apparatus as defined in claim 4, wherein said image input means has an imaging range larger than said chip region, said shifting means being constructed to shift the light of said light source over an entire area of said photosensitive layer on said substrate.

10. The apparatus as defined in claim 4, wherein said shifting means includes an orthogonal shifting means for shifting the light of said irradiating means in two orthogonal directions relative to said photosensitive layer;

said apparatus further comprising:

a detector for detecting a reference position at an outer edge of said substrate;

a position data input device for inputting position data of said peripheral region along said outline of said chip region; and an aligning means for aligning axial directions of said position data and said orthogonal shifting means based on detection results provided by said detector;

said controller for controlling said orthogonal shifting means to shift the light of said light source along said peripheral region based on said position data.

11. An apparatus for exposing a peripheral region around a chip region of a photosensitive layer applied to a substrate along an outline of the chip region, comprising:

a substrate support for supporting said substrate;

a shape input means for inputting shape information of said substrate and said chip region;

image input means for inputting element as image information, a shape of an area around a crossing point of scribe lines in said chip region on said substrate;

an exposure region computing means for determining a position of said crossing point from said inputted image information, computing outline positions of said chip region from said position of said crossing point and said shape information, and computing positions of said peripheral region along said outline of said chip region from said outline positions of said chip region;

a light source for irradiating said photosensitive layer on said substrate with light;

shifting means for shifting the light of said light source relative to said photosensitive layer; and a controller for controlling said shifting means to shift the light of said light source based on said peripheral region data and causing exposure of said peripheral region.

12. The apparatus as defined in claim 11, wherein said shifting means includes orthogonal shifting means for shifting the light of said light source in two orthogonal directions relative to said photosensitive layer, said apparatus further comprising an aligning means for deriving axial directions of said scribe lines in said chip region on said substrate from said image information and aliqninq said axial directions using said orthogonal shifting means.

13. The apparatus as defined in claim 11, further comprising a rotating means for rotating said substrate, wherein said controller divides said peripheral region for exposure with each stepwise rotation by a predetermined degree.

14. The apparatus as defined in claim 11, wherein said shifting means shifts the light of said light source over an entire area of said photosensitive layer on said substrate.

15. The apparatus as defined in claim 11, wherein said shifting means includes an orthogonal shifting means for shifting the light of said light source in two orthogonal directions relative to said photosensitive layer;

said apparatus further comprising:

a detector for detecting a reference position at an outer edge of said substrate;

a position data input device for inputting position data of said peripheral region along said outline of said chip region; and an aligning means for aligning axial directions of said position data and said orthogonal shifting means based on detected results provided by said detector;

said controller controlling said orthogonal shifting means to shift the light of said light source along said peripheral region based on said position data.

* * * * *